US012660289B2

(12) United States Patent (10) Patent No.: US 12,660,289 B2
Chang et al. (45) Date of Patent: Jun. 16, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Po-Chin Chang, Taichung (TW); Lin-Yu Huang, Hsinchu (TW); Li-Zhen Yu, New Taipei (TW); Yuting Cheng, Taoyuan (TW); Sung-Li Wang, Hsinchu (TW); Pinyen Lin, Rochester, NY (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 588 days.

(21) Appl. No.: 18/097,249

(22) Filed: Jan. 15, 2023

(65) Prior Publication Data

US 2024/0096997 A1 Mar. 21, 2024

Related U.S. Application Data

(60) Provisional application No. 63/407,923, filed on Sep. 19, 2022.

(51) Int. Cl.
H10D 64/62 (2025.01)
H10D 30/43 (2025.01)
(Continued)

(52) U.S. Cl.
CPC ............. H10D 64/62 (2025.01); H10D 30/43 (2025.01); H10D 30/6735 (2025.01);
(Continued)

(58) Field of Classification Search
CPC .... H10D 64/62; H10D 30/43; H10D 30/6735; H10D 62/121; H10D 84/017; H10D 84/0186; H10D 84/038; H10D 84/85
See application file for complete search history.

(56) References Cited

U.S. PATENT DOCUMENTS 9,209,247 B2 12/2015 Colinge et al.
9,236,267 B2 1/2016 De et al.
(Continued)

*Primary Examiner* — Jeff W Natalini
*Assistant Examiner* — Rose Keagy
(74) *Attorney, Agent, or Firm* — NZ Carr Law Office

(57) ABSTRACT

Embodiments of the present disclosure provide semiconductor device structures and methods of forming the same. The structure includes a first source/drain region disposed in a PFET region and a second source/drain region disposed in an NFET region. The second source/drain region comprises a dipole region. The structure further includes a first silicide layer disposed on and in contact with the first source/drain region, a second silicide layer disposed on and in contact with the first silicide layer, and a third silicide layer disposed on and in contact with the dipole region of the second source/drain region. The first, second, and third silicide layers include different materials. The structure further includes a first conductive feature disposed over the first source/drain region, a second conductive feature disposed over the second source/drain region, and an interconnect structure disposed on the first and second conductive features.

20 Claims, 47 Drawing Sheets

(51) Int. Cl.

| | |
|---|---|
| *H10D 30/67* | (2025.01) |
| *H10D 62/10* | (2025.01) |
| *H10D 84/01* | (2026.01) |
| *H10D 84/03* | (2025.01) |
| *H10D 84/85* | (2025.01) |

(52) U.S. Cl.
CPC ......... *H10D 62/121* (2025.01); *H10D 84/017* (2025.01); *H10D 84/0186* (2025.01); *H10D 84/038* (2025.01); *H10D 84/85* (2025.01)

(56) References Cited

U.S. PATENT DOCUMENTS

| | | | | |
|---|---|---|---|---|
| 9,412,817 B2 | 8/2016 | Yang et al. | | |
| 9,412,828 B2 | 8/2016 | Ching et al. | | |
| 9,472,618 B2 | 10/2016 | Oxland | | |
| 9,502,265 B1 | 11/2016 | Jiang et al. | | |
| 9,520,482 B1 | 12/2016 | Chang et al. | | |
| 9,536,738 B2 | 1/2017 | Huang et al. | | |
| 9,576,814 B2 | 2/2017 | Wu et al. | | |
| 9,608,116 B2 | 3/2017 | Ching et al. | | |
| 2013/0320450 A1* | 12/2013 | Hoentschel | ........ | H10D 84/0184 |
| | | | | 438/303 |
| 2017/0018463 A1* | 1/2017 | Bu | ................... | H01L 21/76832 |
| 2019/0252381 A1* | 8/2019 | Liu | ........................ | H10D 84/85 |
| 2020/0357802 A1* | 11/2020 | Ting | ................... | H10D 64/027 |
| 2021/0399109 A1* | 12/2021 | Su | ........................ | H10D 62/121 |
| 2022/0130759 A1* | 4/2022 | Huang | ................ | H10D 30/014 |
| 2022/0139903 A1* | 5/2022 | Hung | ................ | H10D 84/0193 |
| | | | | 257/355 |
| 2022/0293759 A1* | 9/2022 | Chou | ................... | H10D 62/121 |

* cited by examiner

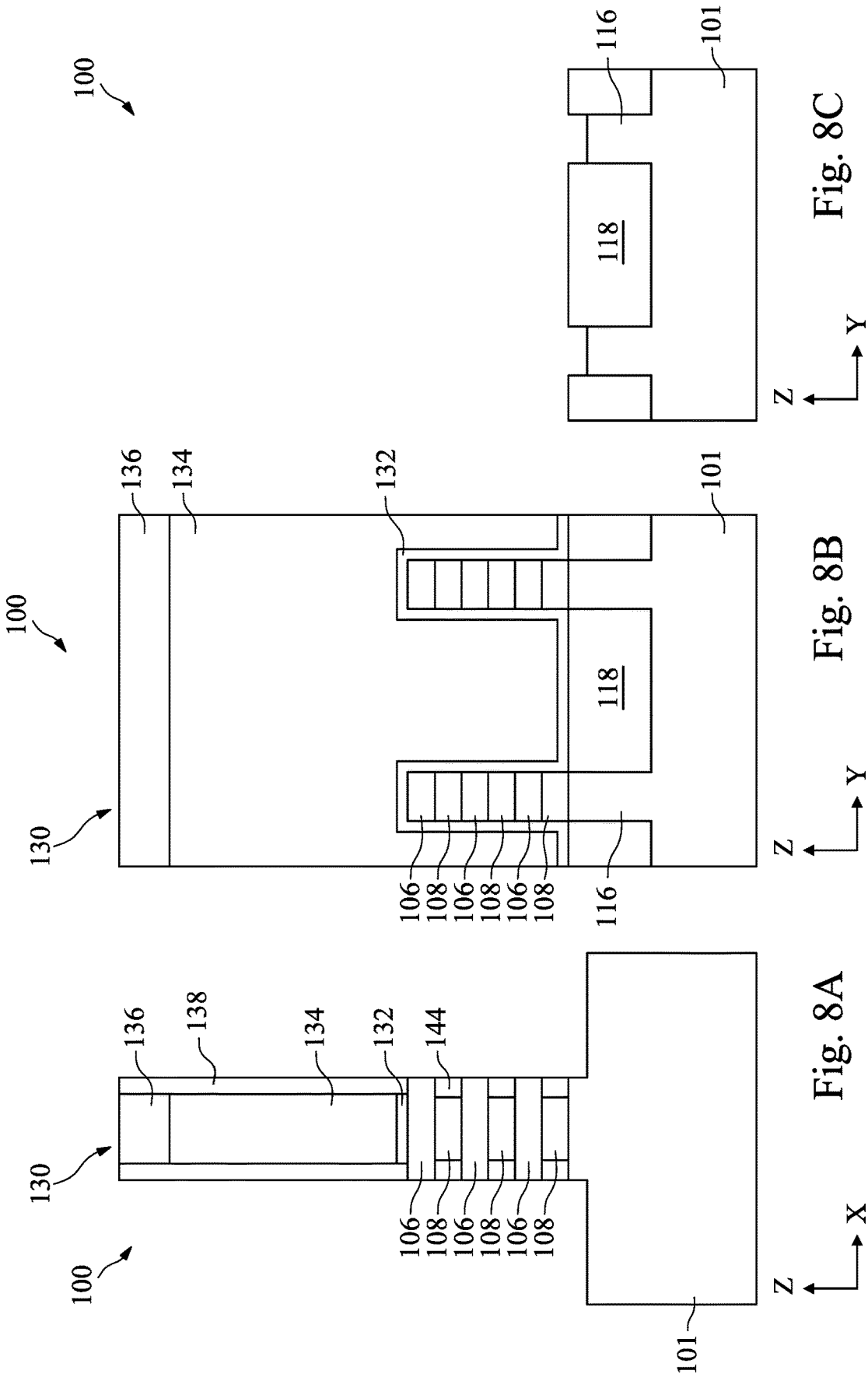

100

164
162
146
120
101

210

212

212

210

Z
Y

100

146

212

206

206

138
220

164
162
138
144
146
170
144
172

146

206

210

212

210

212

120

144

101

Z
Y
X

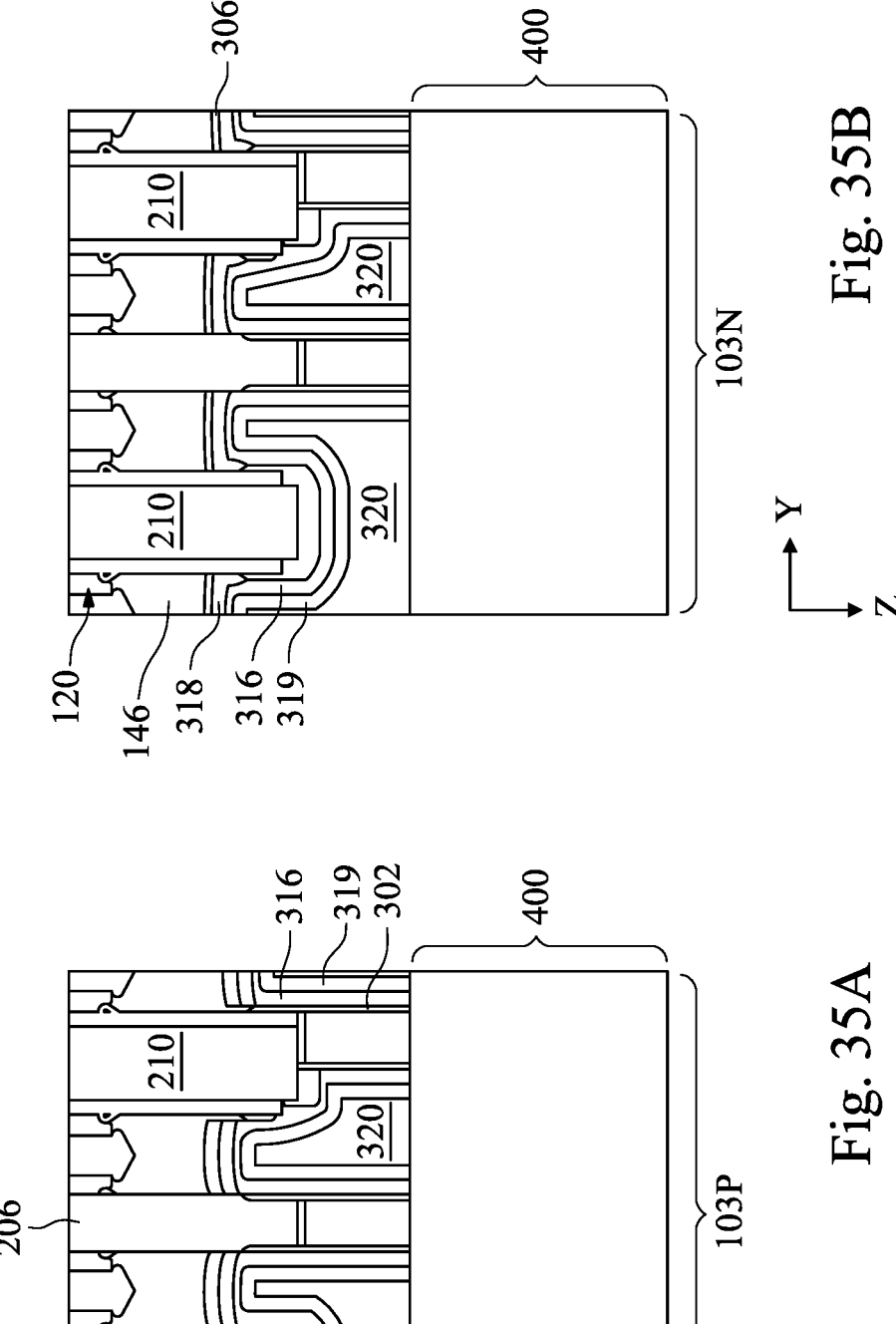
Fig. 35B
Fig. 35A

SEMICONDUCTOR DEVICE STRUCTURE AND METHODS OF FORMING THE SAME

CROSS-REFERENCE TO RELATED APPLICATIONS

This application claims priority to U.S. Provisional Application Ser. No. 63/407,923 filed Sep. 19, 2022, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-11A are cross-sectional side views of various stages of manufacturing the semiconductor device structure taken along line A-A of FIG. 6, in accordance with some embodiments.

FIGS. 7B-11B are cross-sectional side views of various stages of manufacturing the semiconductor device structure taken along line B-B of FIG. 6, in accordance with some embodiments.

FIGS. 7C-11C are cross-sectional side views of various stages of manufacturing the semiconductor device structure taken along line C-C of FIG. 6, in accordance with some embodiments.

FIGS. 12A-24A are perspective views of various stages of manufacturing the semiconductor device structure, in accordance with some embodiments.

FIGS. 12B-24B are cross-sectional side views of various stages of manufacturing the semiconductor device structure taken along line C-C of FIG. 6, in accordance with some embodiments.

FIGS. 25A-36A are cross-sectional side views of various stages of manufacturing a PFET region of the semiconductor device structure taken along line C-C of FIG. 6, in accordance with some embodiments.

FIGS. 25B-36B are cross-sectional side views of various stages of manufacturing an NFET region of the semiconductor device structure taken along line C-C of FIG. 6, in accordance with some embodiments.

FIGS. 37A-45A are perspective views of various stages of manufacturing the semiconductor device structure, in accordance with alternative embodiments.

FIGS. 37B-45B are cross-sectional side views of various stages of manufacturing the semiconductor device structure taken along line C-C of FIG. 6, in accordance with alternative embodiments.

FIG. 43B-1 is an enlarged view of a portion of the semiconductor device structure of FIG. 43B, in accordance with some embodiments.

FIG. 45B-1 is an enlarged view of a portion of the semiconductor device structure of FIG. 45B, in accordance with some embodiments.

DETAILED DESCRIPTION

Figure 1:
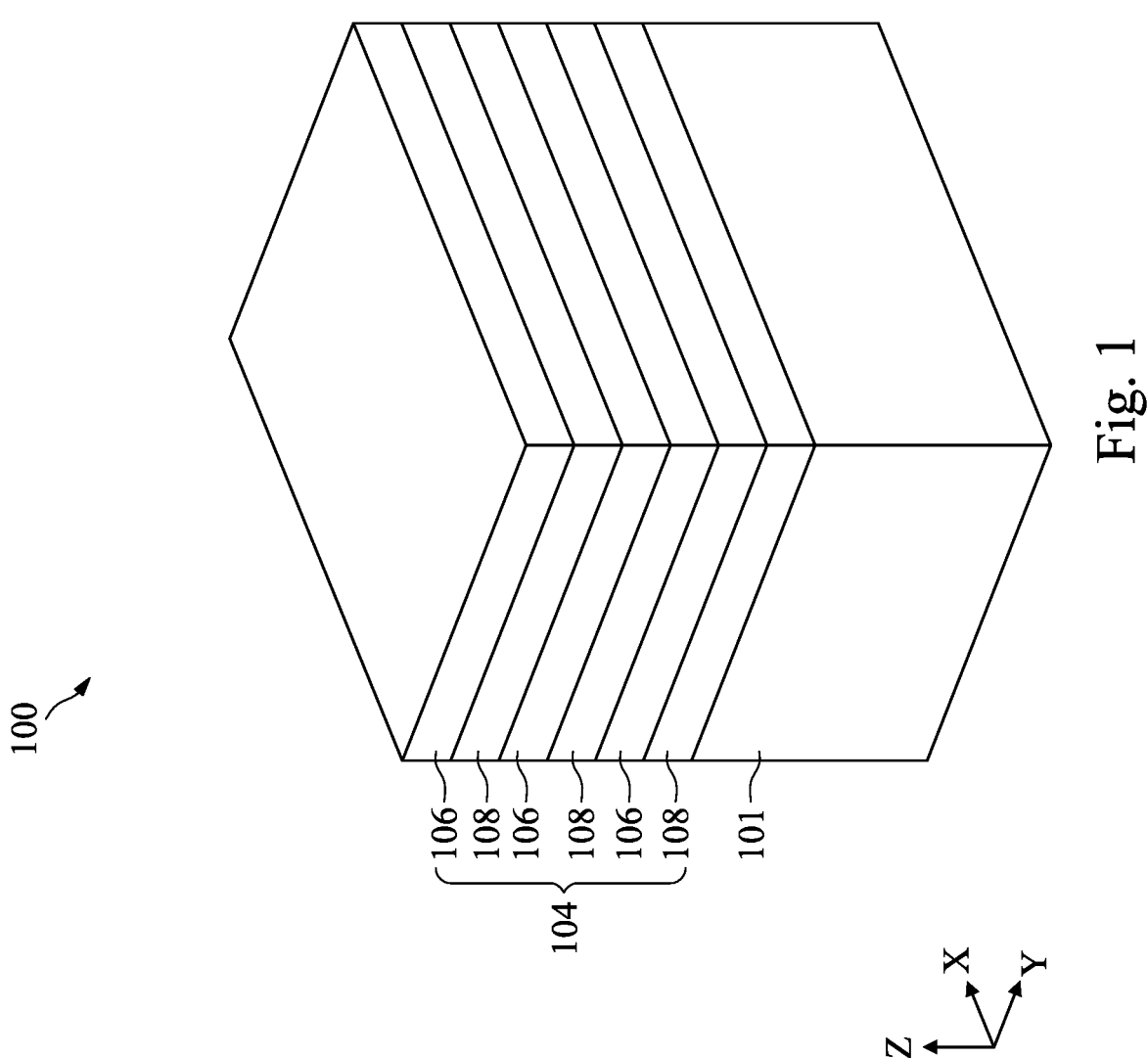
FIGS. 1-6 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide semiconductor device structures having power network moved from the front-side to the backside. For example, a conductive feature, such as a power via, is utilized to connect the front side conductive contact to the backside power for better device performance and to relax front side conductive feature routing complexity. Furthermore, to further push the device performance, n-dipole and p-type selective silicide are utilized to reduce source/drain contact resistance by reducing the Schottky barrier height.

While the embodiments of this disclosure are discussed with respect to nanostructure channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-36B show exemplary processes for manufacturing a semiconductor device structure 100 according to embodiments of the present disclosure. It is understood that additional operations can be provided before, during, and after processes shown by FIGS. 1-36B, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100, in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanostructure channels in a multi-gate device, such as nanostructure channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlinAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanosheet transistors, nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

Figure 2:
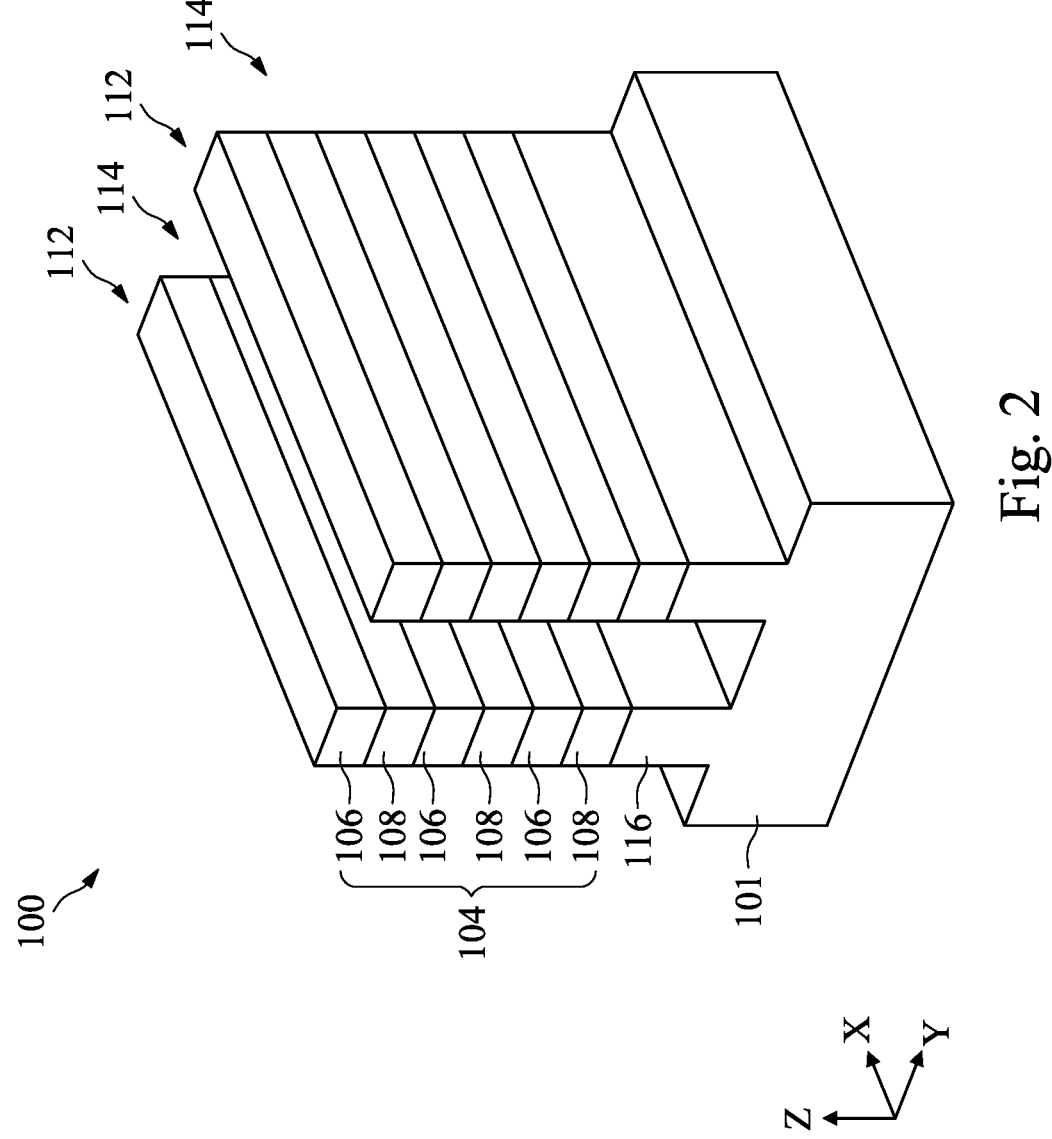

In FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
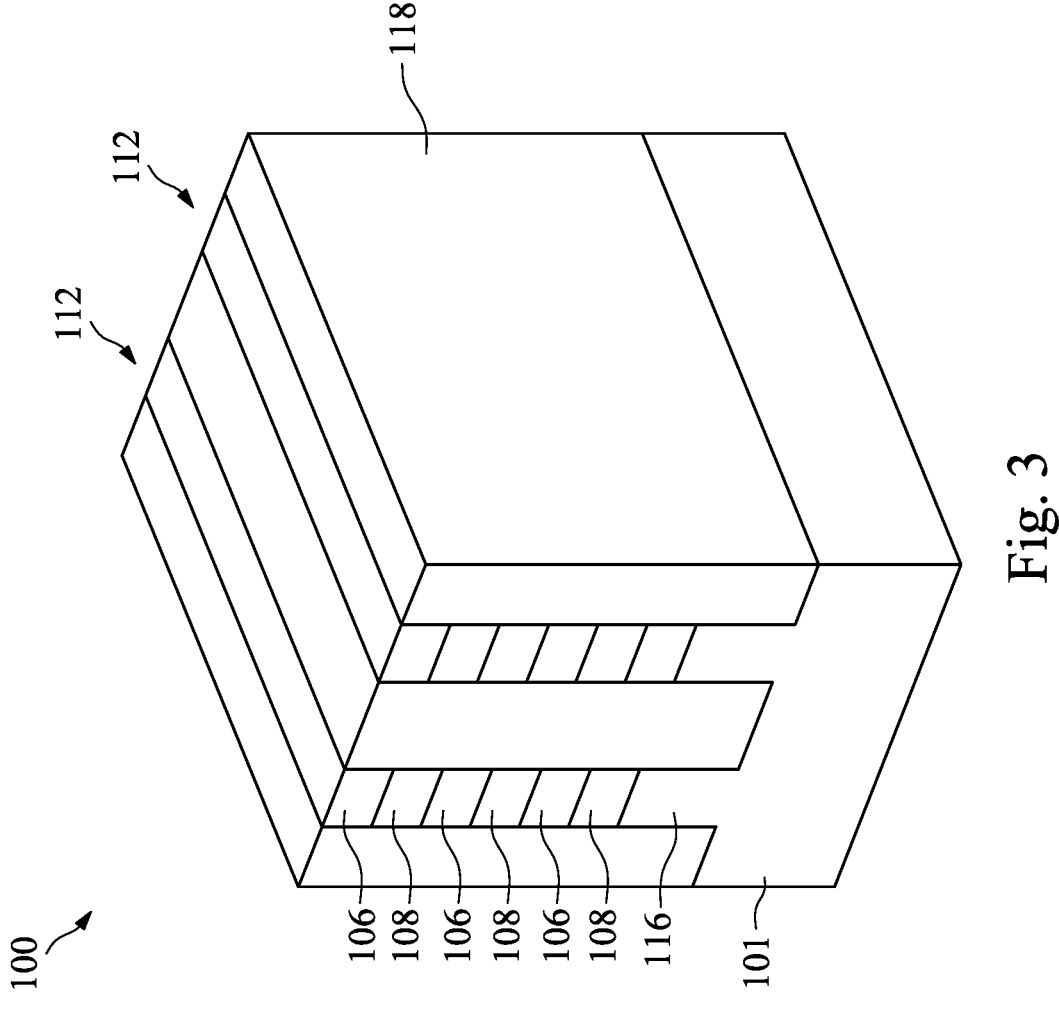

In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
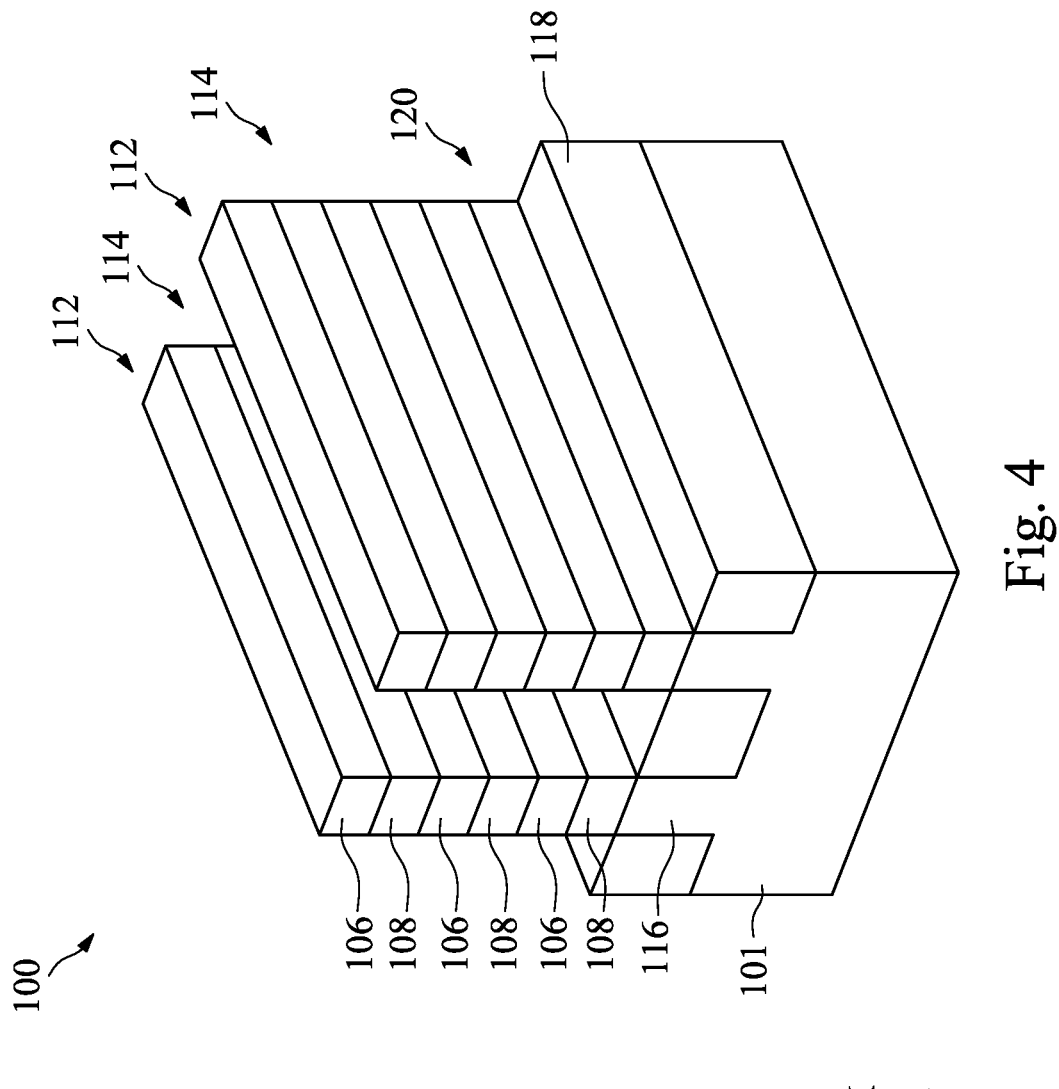

In FIG. 4, the insulating material 118 is recessed to form isolation regions 120. The recess of the insulating material 118 exposes portions of the fin structures 112, such as the stack of semiconductor layers 104. The recess of the insulating material 118 reveals the trenches 114 between the neighboring fin structures 112. The isolation regions 120 may be formed using a suitable process, such as a dry etching process, a wet etching process, or a combination thereof. A top surface of the insulating material 118 may be level with or below a surface of the second semiconductor layers 108 in contact with the well portion 116 formed from the substrate 101.

Figure 5:
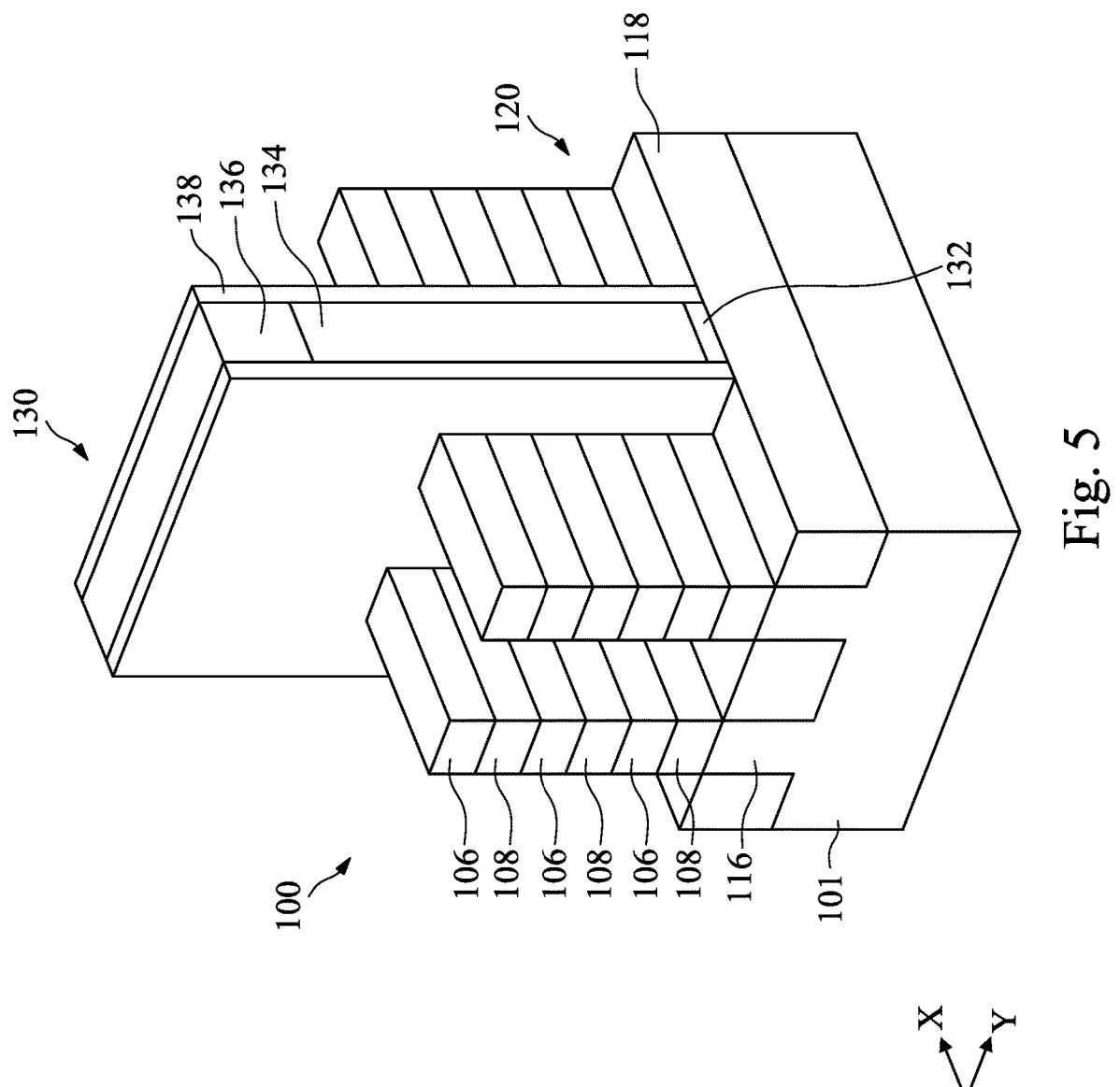

In FIG. 5, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. Gate spacers 138 are then formed on sidewalls of the sacrificial gate structures 130. The gate spacers 138 may be formed by conformally depositing one or more layers for the gate spacers 138 and anisotropically etching the one or more layers, for example. While one sacrificial gate structure 130 is shown, two or more sacrificial gate structures 130 may be arranged along the X direction in some embodiments.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The portions of the fin structures 112 that are covered by the sacrificial gate electrode layer 134 of the sacrificial gate structure 130 serve as channel regions for the semiconductor device structure 100.

Figure 6:
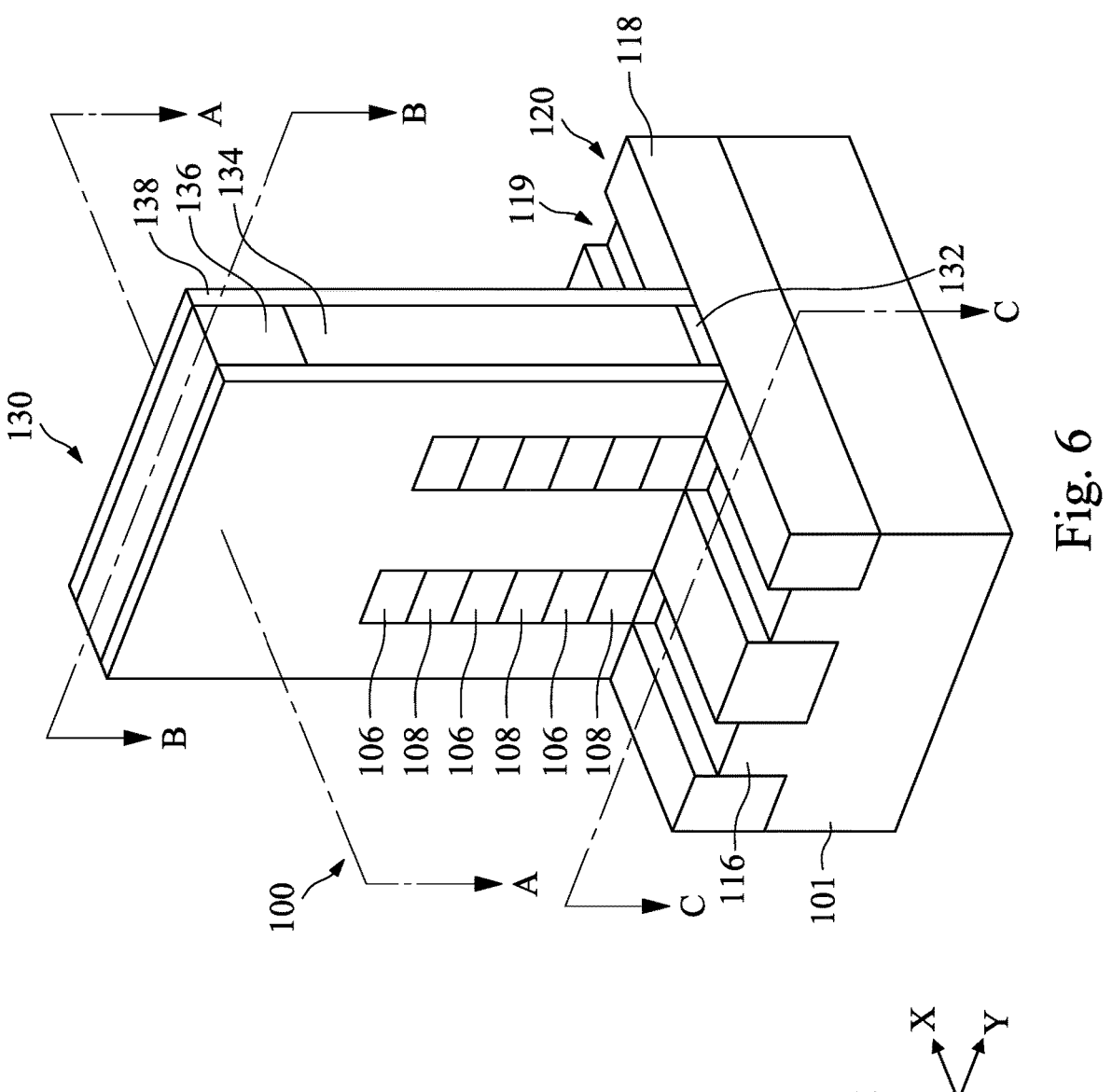

In FIG. 6, the portions of the fin structures 112 not covered by the sacrificial gate structure 130 and the gate spacers 138 are recessed to a level above, at, or below the top surfaces of the isolation regions 120. The recess of the portions of the fin structures 112 can be done by an etch process, either isotropic or anisotropic etch process, and the etch process may be selective with respect to one or more crystalline planes of the substrate 101. The etch process may be a dry etch, such as a RIE, NBE, or the like, or a wet etch, such as using tetramethyalammonium hydroxide (TMAH), ammonium hydroxide (NH₄OH), or any suitable etchant.

Figures 7A, 7B, 7C:
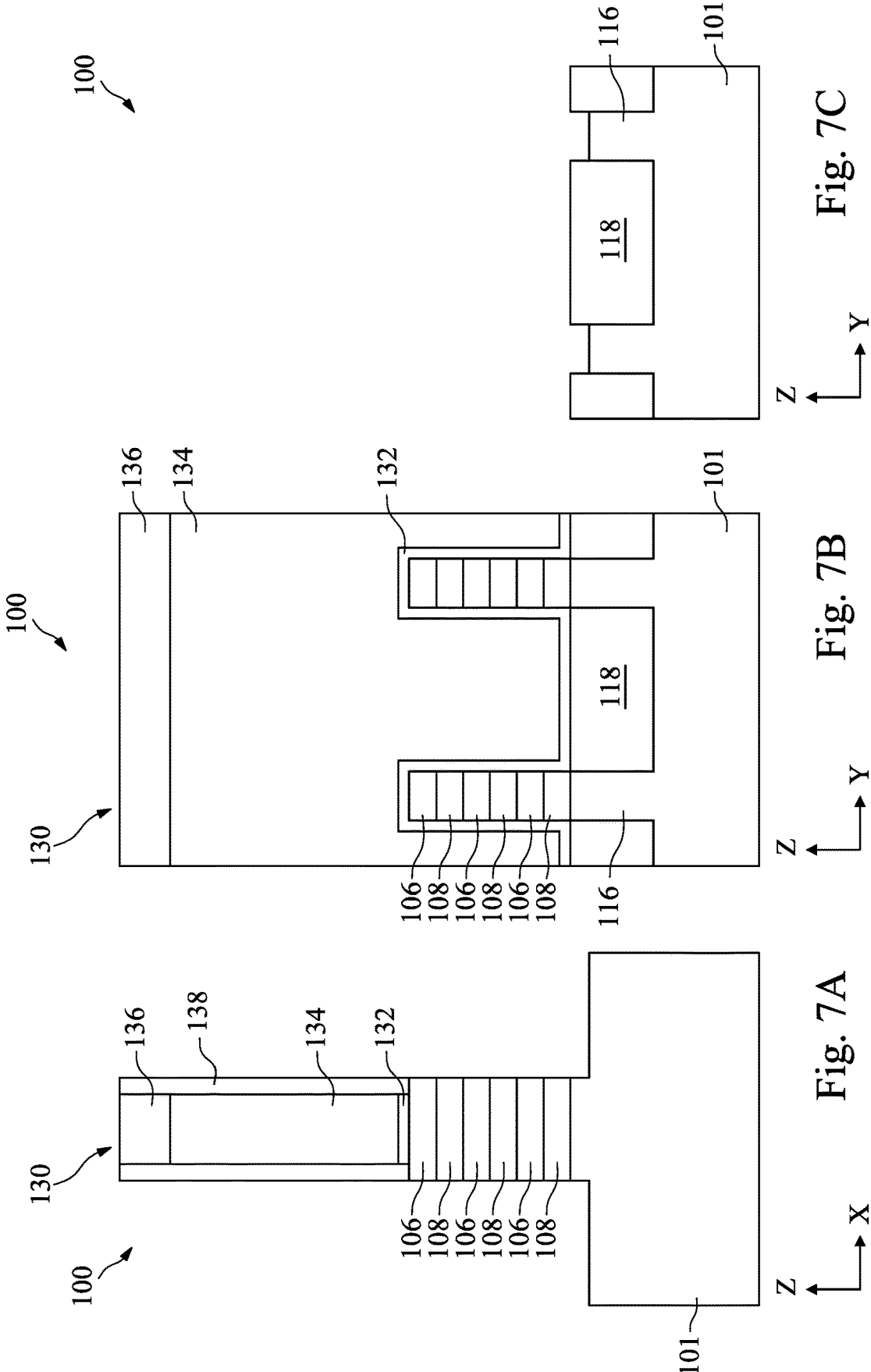

FIGS. 7A, 7B, and 7C are cross-sectional side views of the semiconductor device structure 100 taken along line A-A, line B-B, and line C-C of FIG. 6, respectively.

FIGS. 8A, 8B, and 8C are cross-sectional side views of one of various stages of manufacturing the semiconductor device structure 100 taken along line A-A, line B-B, and line C-C of FIG. 6, respectively, in accordance with some embodiments. As shown in FIG. 8A, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etch process. In cases where the second semiconductor layers 108 are made of SiGe and the first semiconductor layers 106 are made of silicon, the second semiconductor layer 108 can be selectively etched using a wet etchant such as, but not limited to, ammonium hydroxide (NH₄OH), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figures 9A, 9B, 9C:
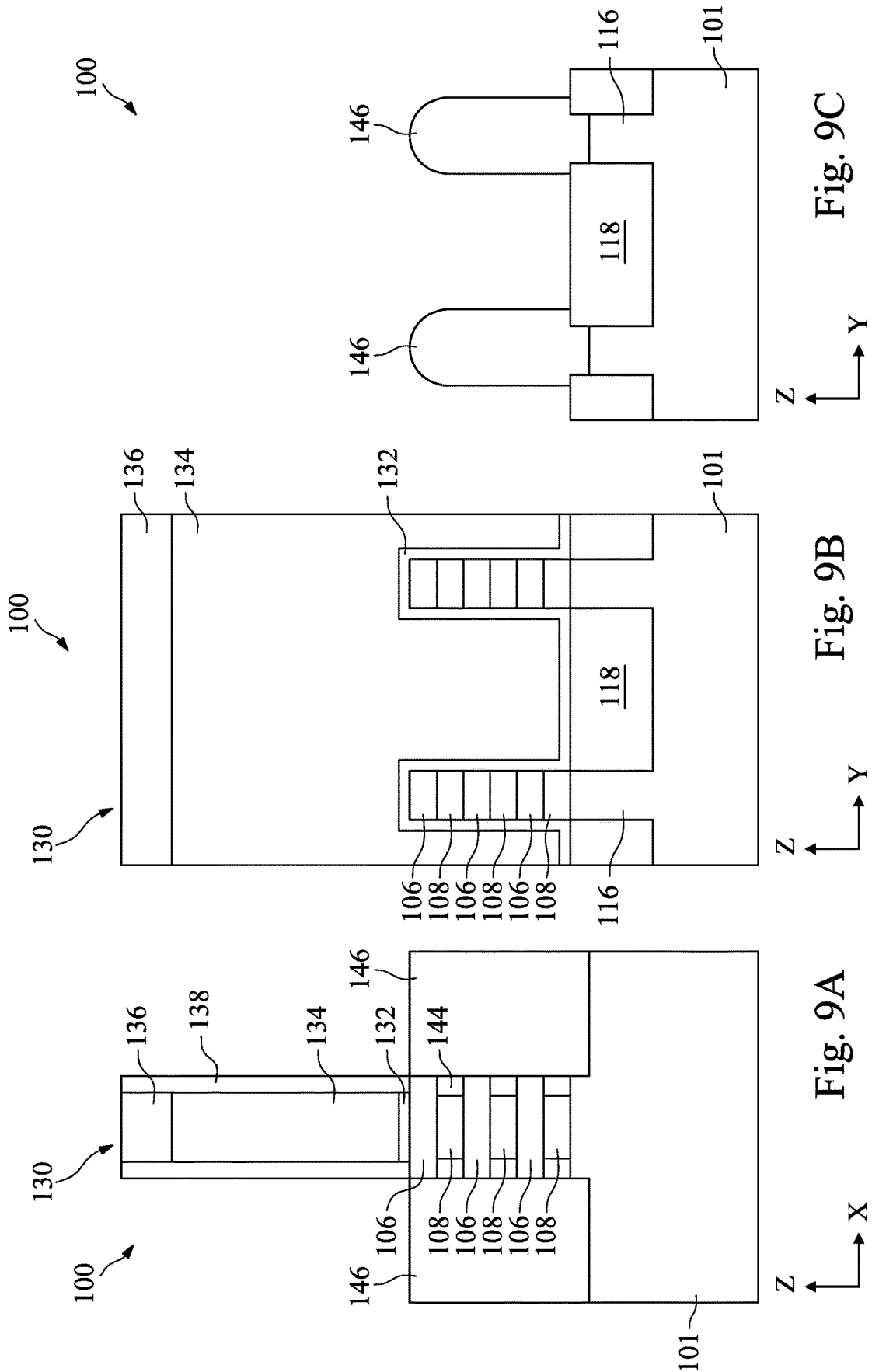

FIGS. 9A, 9B, and 9C are cross-sectional side views of one of various stages of manufacturing the semiconductor device structure 100 taken along line A-A, line B-B, and line C-C of FIG. 6, respectively, in accordance with some embodiments. As shown in FIGS. 9A and 9C, source/drain (S/D) regions 146 are formed from the well portion 116. The S/D regions 146 may grow both vertically and horizontally to form facets, which may correspond to crystalline planes of the material used for the well portion 116. In this disclosure, a source region and a drain region are interchangeably used, and the structures thereof are substantially the same. Furthermore, source/drain region(s) may refer to a source or a drain, individually or collectively dependent upon the context. The S/D regions 146 may be made of one or more layers of Si, SiP, SiC and SiCP for n-type FETs (NFETs) or Si, SiGe, Ge for p-type FETs (PFETs). For PFETs, p-type dopants, such as boron (B), may also be included in the S/D regions 146. The S/D regions 146 may be formed by an epitaxial growth method using CVD, ALD or MBE. In some embodiments, S/D regions 146 for NFETs and PFETs are formed over the substrate 101. In other words, the semiconductor device structure 100 includes S/D regions 146 for NFETs and S/D regions 146 for PFETs.

Figures 10A, 10B, 10C:
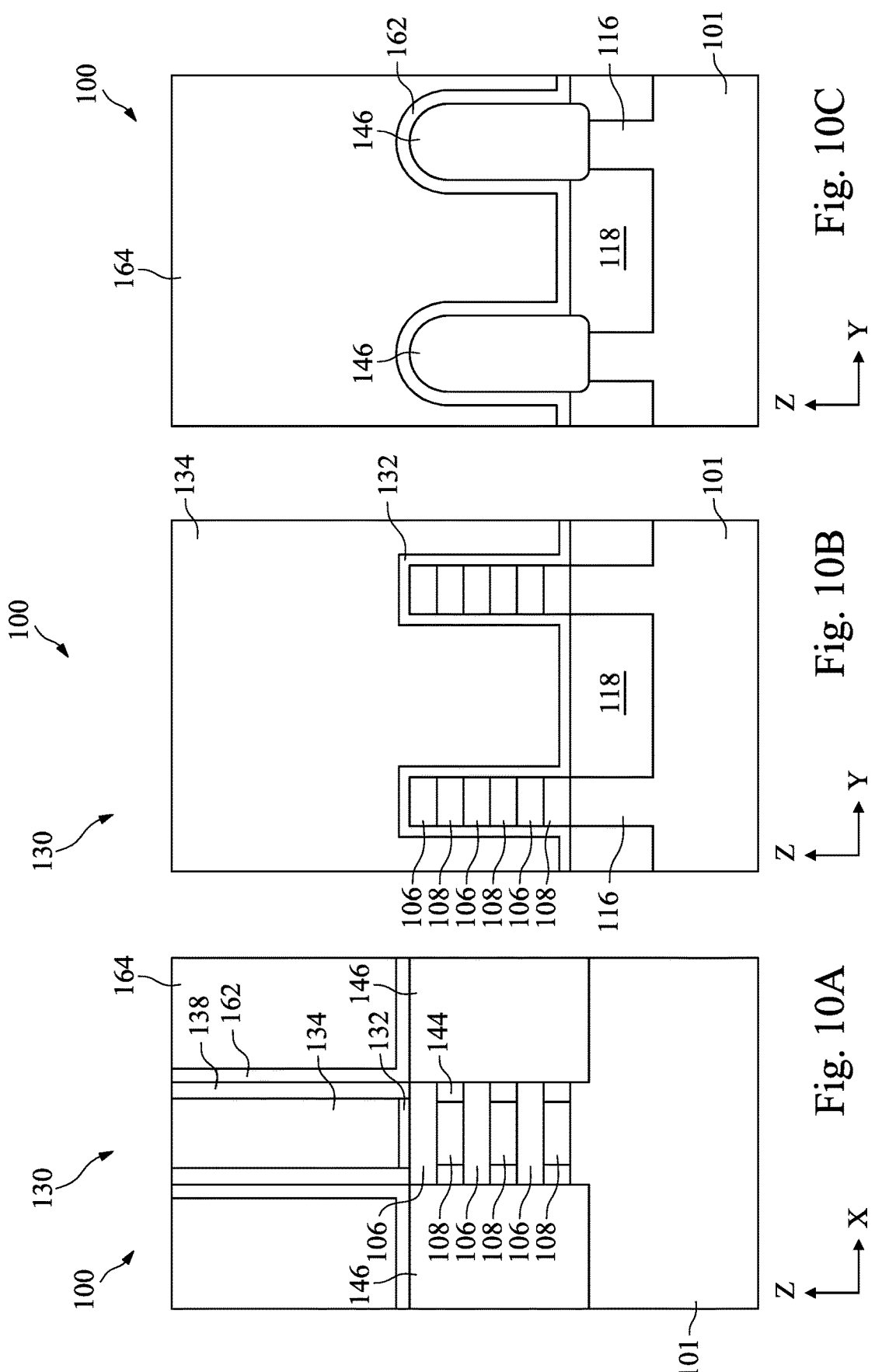

FIGS. 10A, 10B, and 10C are cross-sectional side views of one of various stages of manufacturing the semiconductor device structure 100 taken along line A-A, line B-B, and line C-C of FIG. 6, respectively, in accordance with some embodiments. In FIGS. 10A, 10B, and 10C, a contact etch stop layer (CESL) 162 is conformally formed on the exposed surfaces of the semiconductor device structure 100. The CESL 162 covers the sidewalls of the sacrificial gate structure 130, the insulating material 118, and the S/D regions 146. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include compounds including Si, 0, C, and/or H, such as silicon oxide, SiCOH, or SiOC. Organic materials, such as polymers, may also be used for the ILD layer 164. The ILD layer 164 may be deposited by a PECVD process or other suitable deposition technique. In some embodiments, after formation of the ILD layer 164, the semiconductor device structure 100 may be subject to a thermal process to anneal the ILD layer 164.

After the ILD layer 164 is formed, a planarization operation, such as CIVIP, is performed on the semiconductor device structure 100 until the sacrificial gate electrode layer 134 is exposed, as shown in FIGS. 10A and 10B.

Figures 11A, 11B, 11C:
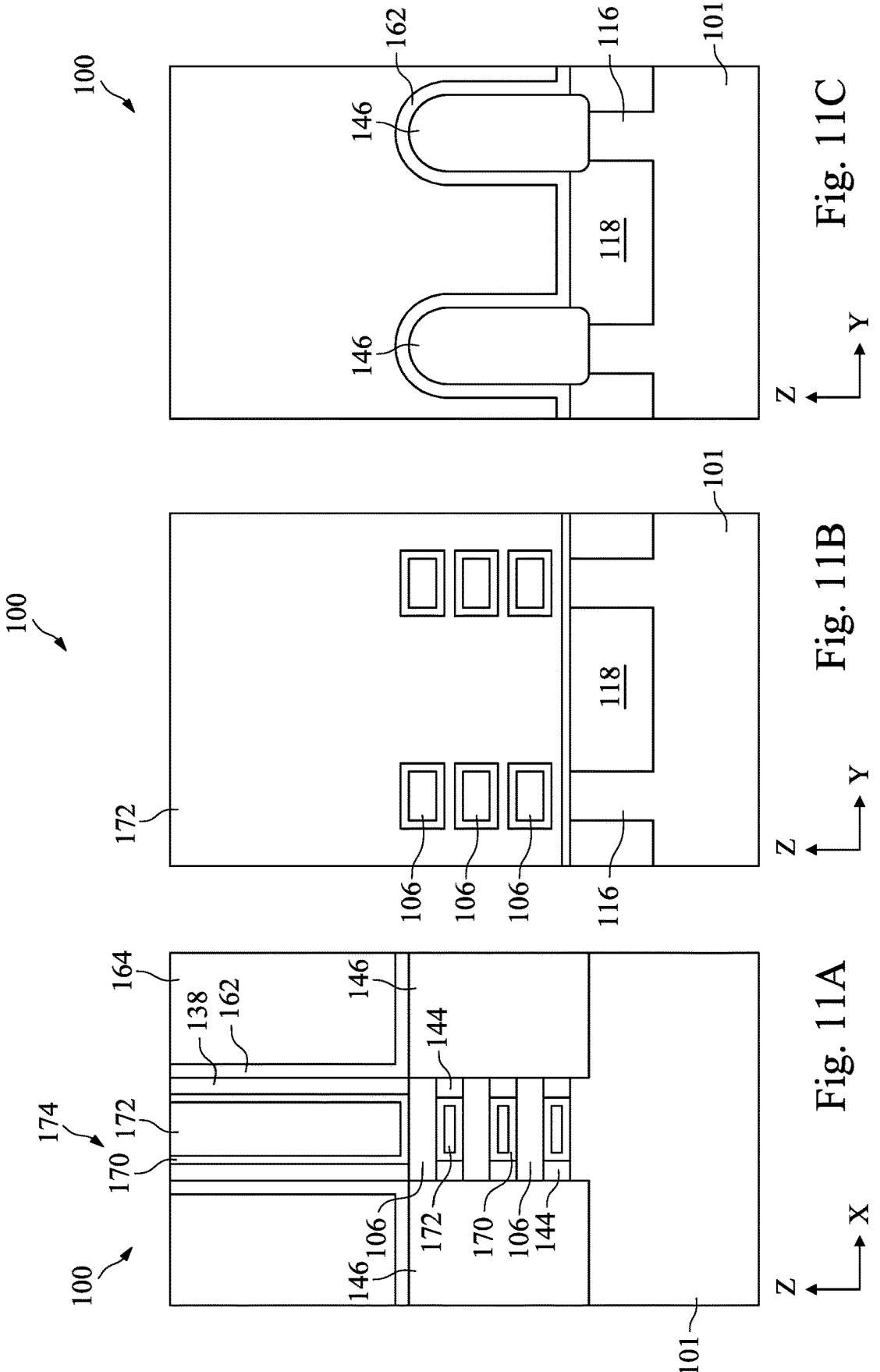

FIGS. 11A, 11B, and 11C are cross-sectional side views of one of various stages of manufacturing the semiconductor device structure 100 taken along line A-A, line B-B, and line C-C of FIG. 6, respectively, in accordance with some embodiments. As shown in FIGS. 11A and 11B, the sacrificial gate structure 130 and the second semiconductor layers 108 are removed. The removal of the sacrificial gate structure 130 and the semiconductor layers 108 forms an opening between gate spacers 138 and between first semiconductor layers 106. The ILD layer 164 protects the S/D regions 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric material 125, the ILD layer 164, and the CESL 162.

Portions of the second semiconductor layers 108 may be removed using a selective wet etching process. In cases where the second semiconductor layers 108 are made of SiGe and the first semiconductor layers 106 are made of Si, the chemistry used in the selective wet etching process removes the SiGe while not substantially affecting Si, the dielectric materials of the gate spacers 138, and the dielectric spacers 144. In one embodiment, the second semiconductor layers 108 can be removed using a wet etchant such as, but not limited to, hydrofluoric (HF), nitric acid ($HNO_3$), hydrochloric acid (HCl), phosphoric acid ($H_3PO_4$), a dry etchant such as fluorine-based (e.g., $F_2$) or chlorine-based gas (e.g., $Cl_2$), or any suitable isotropic etchants.

After the formation of the nanostructure channels (i.e., the exposed portions of the first semiconductor layers 106), a gate dielectric layer 170 is formed to surround the exposed portions of the first semiconductor layers 106, and a gate electrode layer 172 is formed on the gate dielectric layer

170. The gate dielectric layer 170 and the gate electrode layer 172 may be collectively referred to as a gate structure 174. In some embodiments, an interfacial layer (IL) (not shown) is formed between the gate dielectric layer 170 and the exposed surfaces of the first semiconductor layers 106. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer 170 may be formed by CVD, ALD or any suitable deposition technique. The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electro-plating, or other suitable deposition technique. The gate electrode layer 172 may be also deposited over the upper surface of the ILD layer 164. The gate dielectric layer 170 and the gate electrode layer 172 formed over the ILD layer 164 are then removed by using, for example, CMP, until the top surface of the ILD layer 164 is exposed.

Figures 12A, 12B:
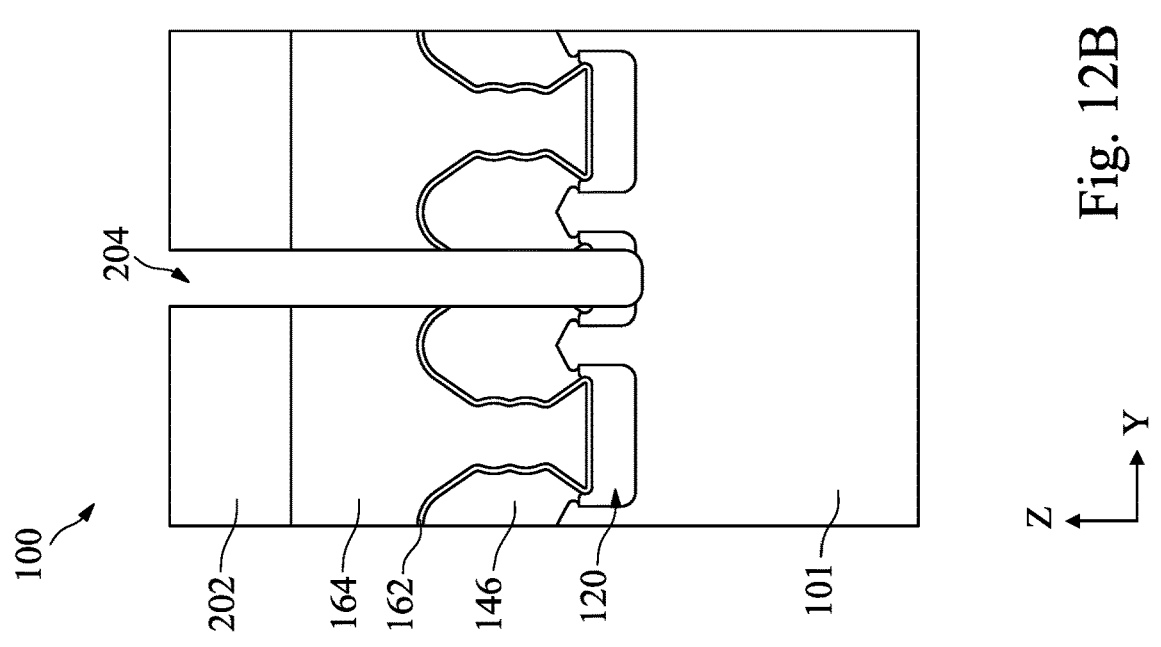

FIGS. 12A-24A are perspective views of various stages of manufacturing the semiconductor device structure 100, in accordance with some embodiments. FIGS. 12B-24B are cross-sectional side views of various stages of manufacturing the semiconductor device structure 100 taken along line C-C of FIG. 6, in accordance with some embodiments. Furthermore, FIGS. 12B-24B are cross-sectional views of the Z-Y plane of FIGS. 12A-24A, respectively. As shown in FIGS. 12A and 12B, a hard mask 202 is formed on the ILD layer 164. The hard mask 202 may include a dielectric material, such as SiN, SiCN, SiOCN, SiOC, or other suitable dielectric material. The hard mask 202 may be used to form openings 204 in the ILD layer 164, the CESL 162, and the isolation regions 120. The openings 204 may be formed between adjacent S/D regions 146. In the channel regions, the openings 204 are formed in the gate electrode layer 172, the gate dielectric layer 170, and the isolation regions 120 (FIG. 11B). The openings 204 may be formed to separate the gate structure 174 into multiple portions of the gate structure 174 (or separate the gate electrode layer 172 into multiple gate electrode layers 172). The process may be referred to as a cut metal gate (CMG) process. The openings 204 may be formed by one or more etch processes. In some embodiments, portions of the substrate 101 are exposed in the openings 204.

Figures 13A, 13B:
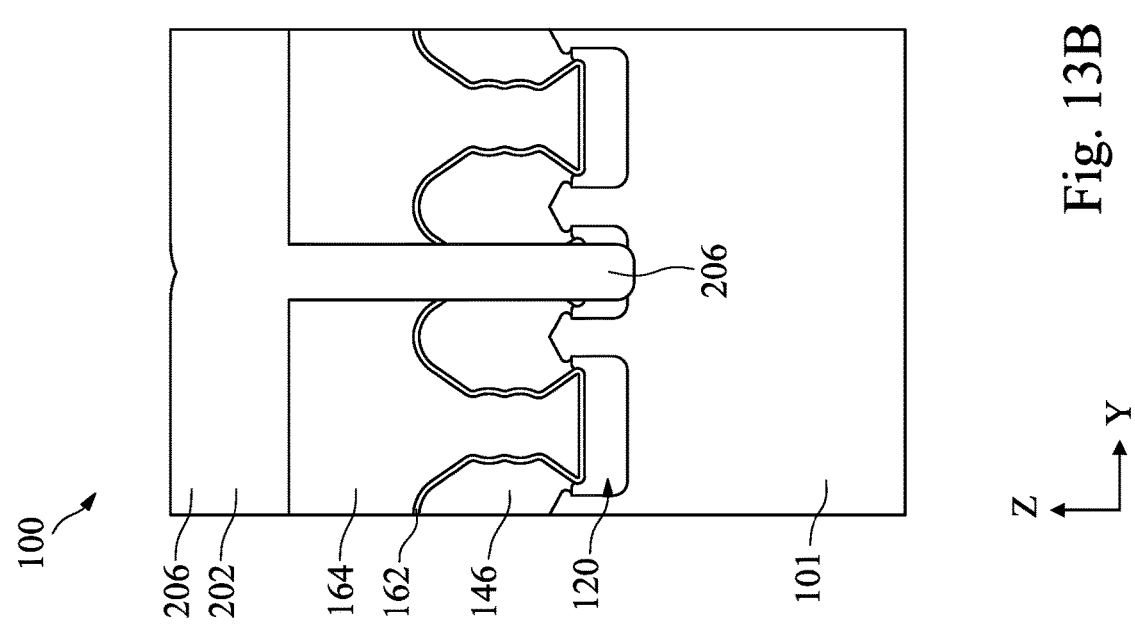

As shown in FIGS. 13A and 13B, a dielectric material 206 is formed in each opening 204. The dielectric material 206 may include any suitable dielectric material, such as SiN. In some embodiments, the dielectric material 206 includes the same material as the hard mask 202. The dielectric material 206 may be also formed on the hard mask 202.

Figures 14A, 14B:
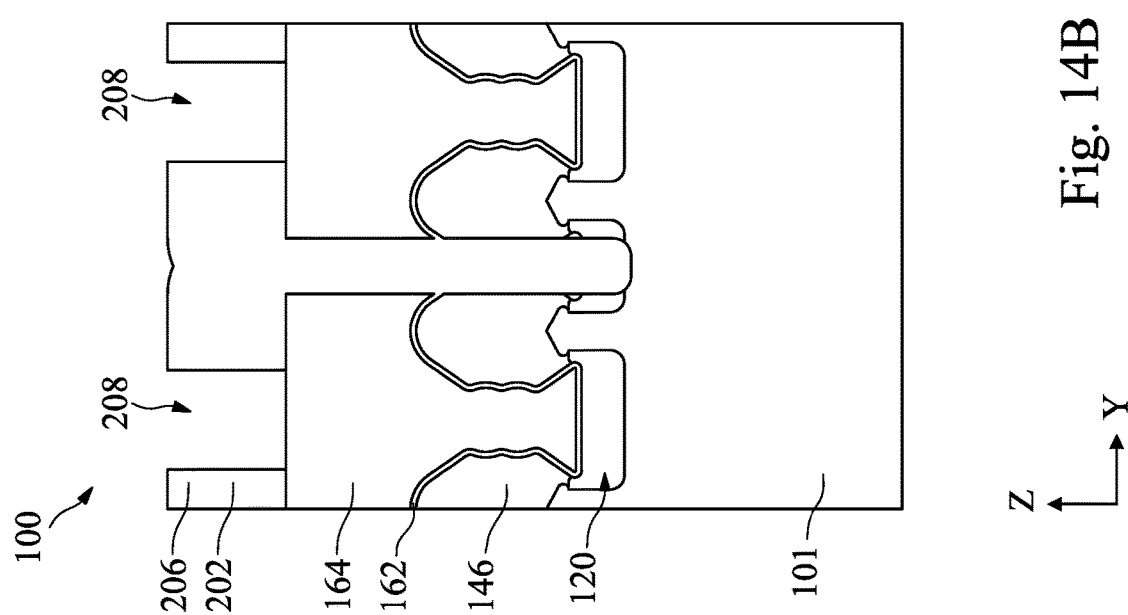

As shown in FIGS. 14A and 14B, openings 208 are formed in the dielectric material 206 and the hard mask 202 to expose portions of the ILD layer 164 located between adjacent S/D regions 146. In some embodiments, one or more portions of the gate structures 174 are also exposed in the openings 208.

Figures 15A, 15B:
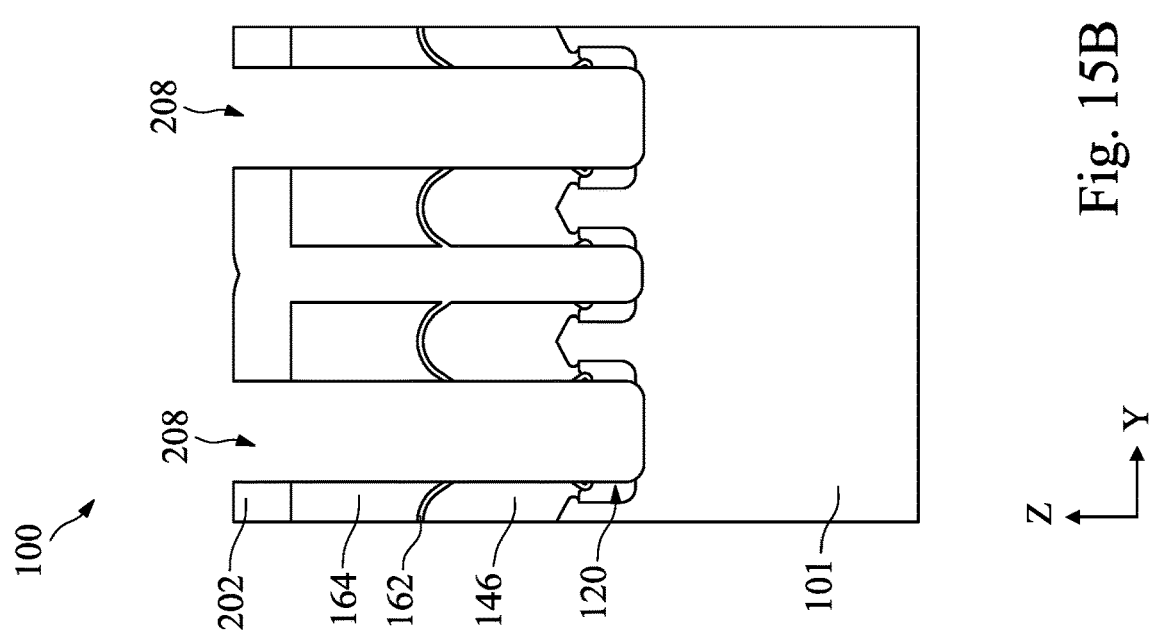

As shown in FIGS. 15A and 15B, the exposed portions of the ILD layer 164 and the exposed one or more portions of the gate structures 174 are removed to expose portions of the substrate 101. The removal of the materials may be performed by one or more etch processes. In some embodiments, the portion of the dielectric material 206 formed on the hard mask 202 is also removed. In some embodiments, portions of the CESL 162 disposed on side surfaces of the S/D regions 146 are also removed. In the channel regions, the exposed portions of the gate structures 174 and the gate spacers 138 in contact thereof are removed.

Figures 16A, 16B:
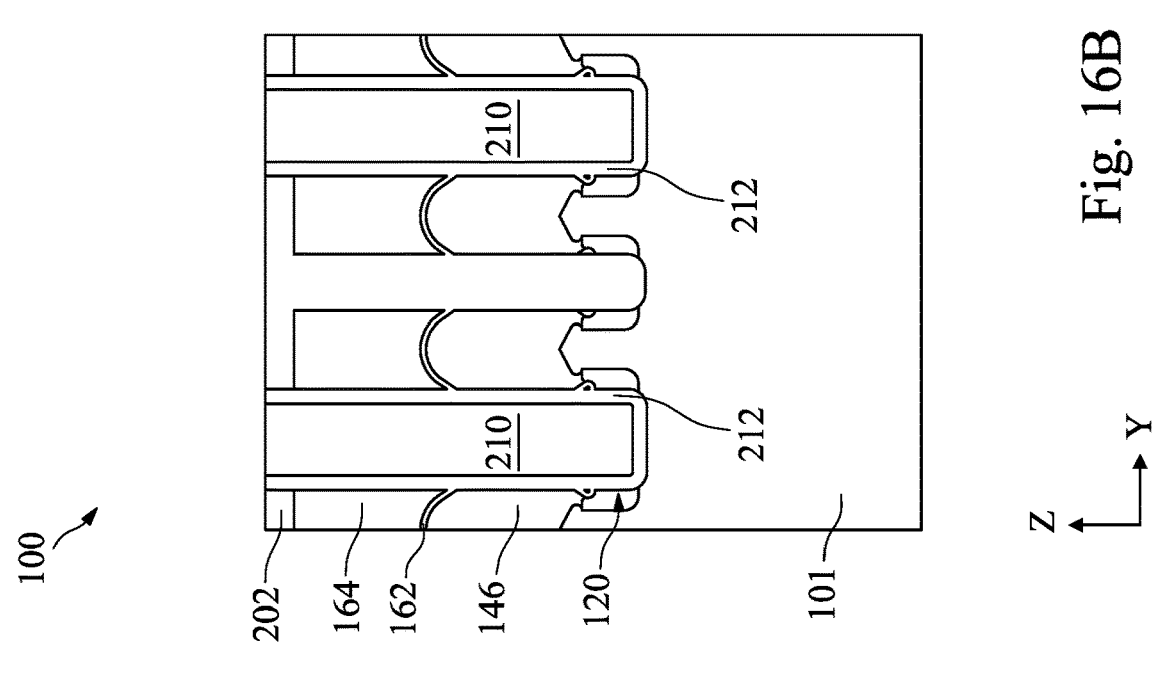

As shown in FIGS. 16A and 16B, conductive features 210 are formed in the openings 208. Each conductive feature 210 includes an electrically conductive material, such as Ti, TiN, W, Ru, Mo, Co, Cu, or other suitable electrically conductive material. Barrier layers (not shown) may or may not be used for the conductive features 210. A liner 212 may be first formed in each opening 208, and the conductive feature 210 is formed on the liner 212. The liner 212 includes any suitable dielectric material. In some embodiments, the liner 212 includes the same material as the dielectric material 206. A planarization process, such as a CMP process, may be performed after depositing the conductive features 210 in the openings 208, and portions of the conductive features 210 and portions of the liners 212 formed on the hard mask 202 may be removed by the planarization process. In some embodiments, the conductive features 210 are power vias for supplying power from the backside of the semiconductor device structure 100.

Figures 17A, 17B:
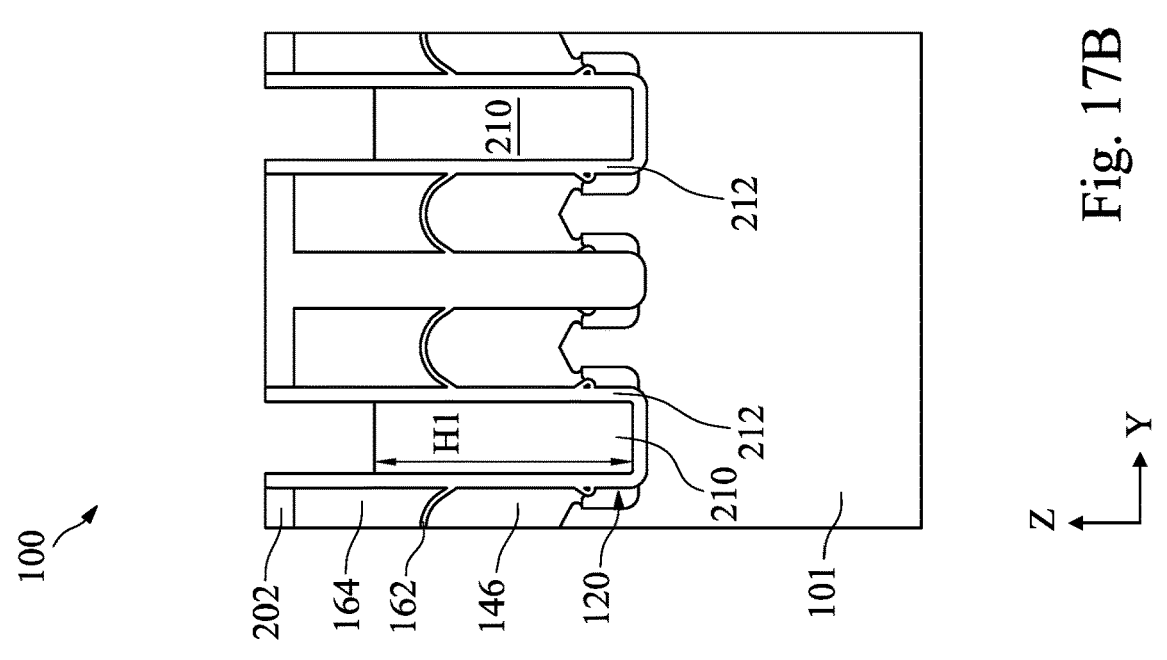

As shown in FIGS. 17A and 17B, the conductive features 210 are recessed. The recessing of the conductive features 210 may be performed by a selective etch process that does not substantially affect the hard mask 202, the dielectric material 206, and the liners 212. After the recessing the conductive features 210, each conductive feature 210 has a height H1. In some embodiments, the height H1 ranges from about 50 nm to about 150 nm. The conductive features 210 are recessed so dielectric materials 214 (FIG. 18B) can be formed on the conductive features 210 between adjacent ILD layers 164. The dielectric materials 214 are utilized to protect the portion of the conductive feature 210 in the channel region during the subsequent processes. Thus, if the height H1 of the conductive feature 210 is greater than about 150 nm, i.e., not enough conductive feature 210 is recessed, there may not be enough dielectric material 214 to protect the portion of the conductive feature 210. On the other hand, if the height H1 of the conductive feature 210 is less than about 50 nm, i.e., too much of the conductive feature 210 is recessed, the electrical resistance of the conductive feature 210 may be substantially higher.

Figures 18A, 18B:
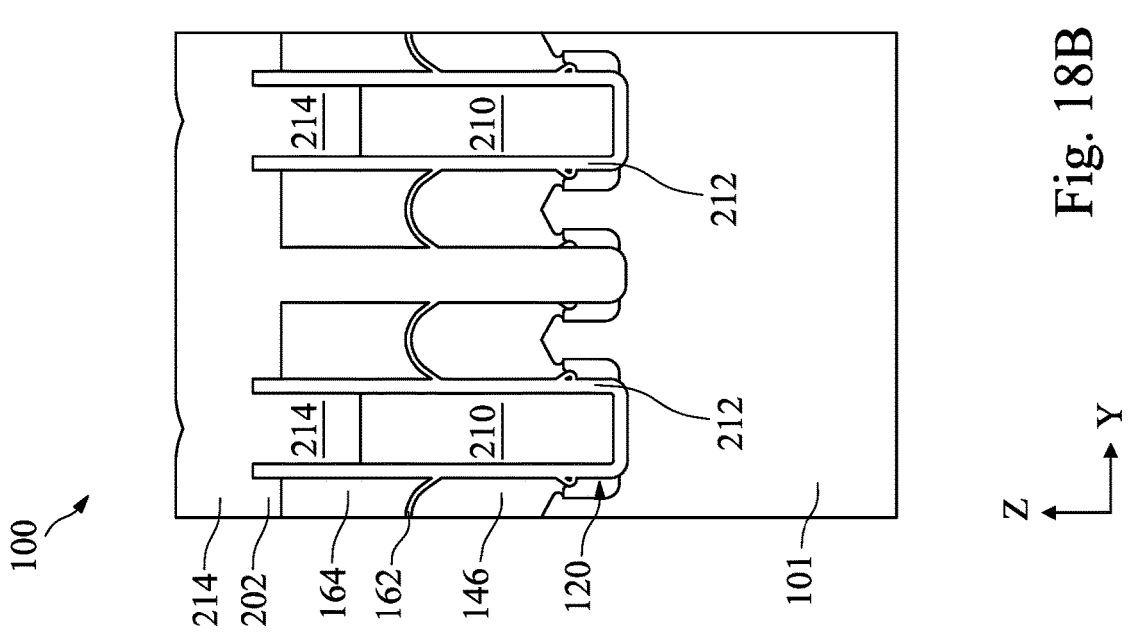

As shown in FIGS. 18A and 18B, the dielectric material 214 is formed on the conductive features 210 between adjacent ILD layers 164 and on the hard mask 202. The dielectric material 214 may include any suitable material. In some embodiments, the dielectric material 214 may include the same material as the dielectric material 206.

Figures 19A, 19B:
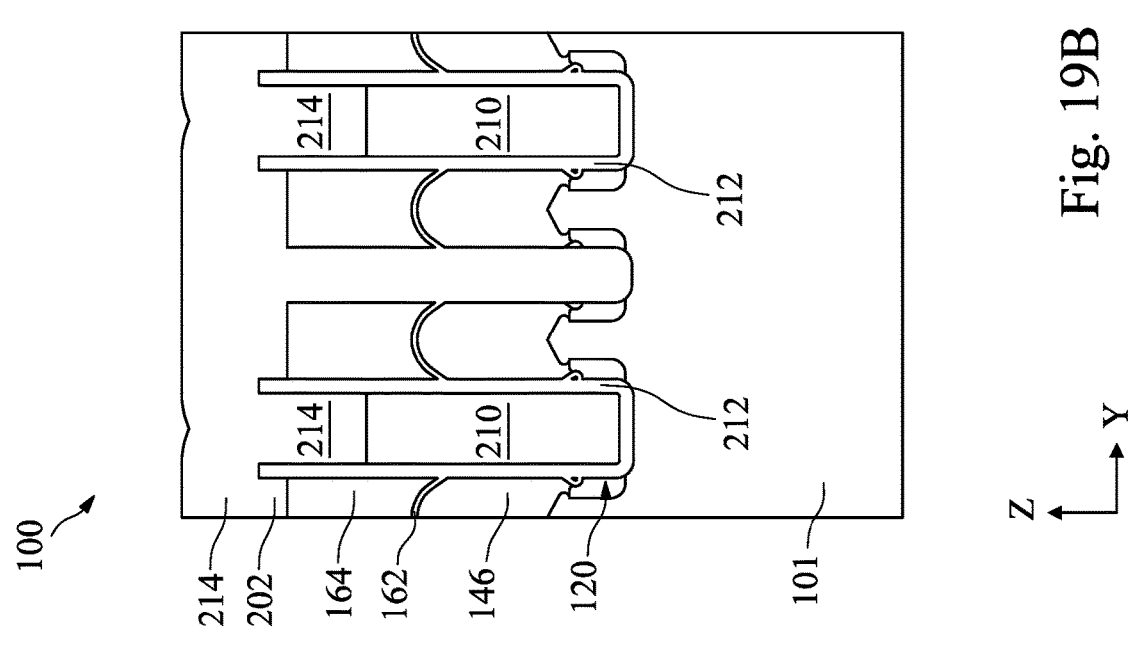

As shown in FIGS. 19A and 19B, an opening 218 is formed in the dielectric material 214 and the hard mask 202 to expose a gate structure 174 (the gate dielectric layer 170 and the gate electrode layer 172) and the gate spacers 138 in contact therewith. Portions of the dielectric material 206 and dielectric materials 214 are also exposed in the opening 218.

Figures 20A, 20B:
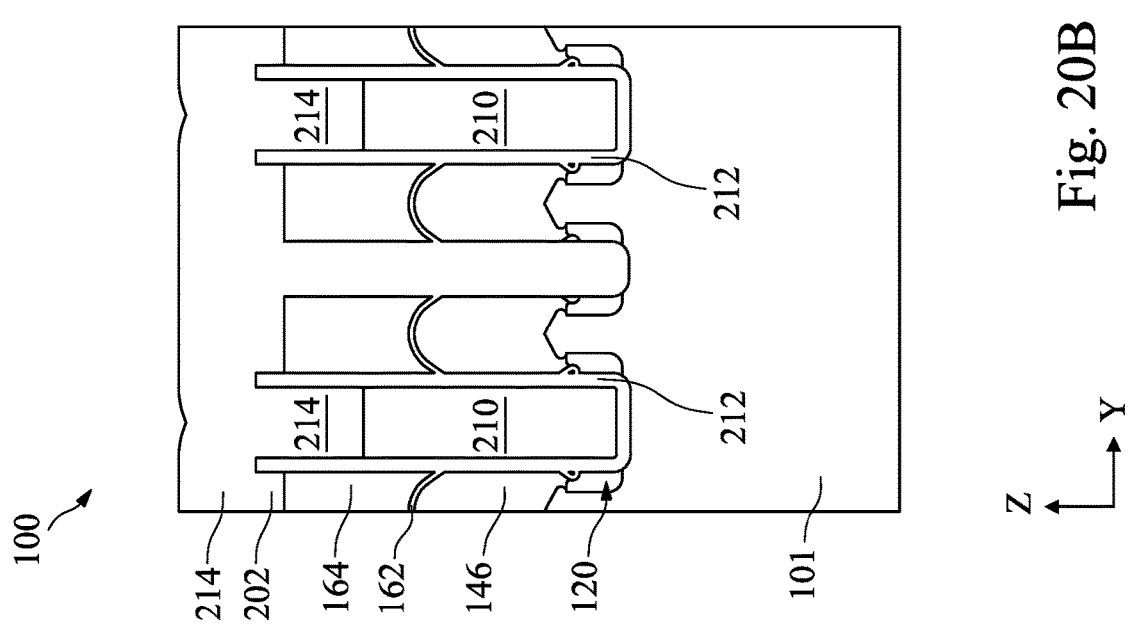

As shown in FIGS. 20A and 20B, the gate electrode layer 172 and the gate dielectric layer 170 exposed in the opening 218 are removed. Portions of the first semiconductor layers 106 disposed below the removed gate electrode layer 172 are also removed. The removal of the gate electrode layer 172, the gate dielectric layer 170, and the first semiconductor layers 106 may be performed by one or more etch processes. The one or more etch processes may be selective etch processes. As a result, the gate spacers 138, the dielectric material 214, and the dielectric materials 206 are not substantially affected. Furthermore, the one or more etch processes may include at least one anisotropic etch process, and portions of the first semiconductor layers 106 located under the gate spacers 138 and between dielectric spacers 144 are not removed. The portions of the dielectric material 214 exposed in the opening 218 protect the portions of the conductive features 210 in the channel regions. As a result, the opening 218 may be a trench having the portions of the conductive features 210, portions of the dielectric material 214 disposed on the portions of the conductive features 210, and a portion of the dielectric material 206 disposed in the trench. In some embodiments, a portion of the substrate 101 is exposed in the opening 218.

Figures 21A, 21B:
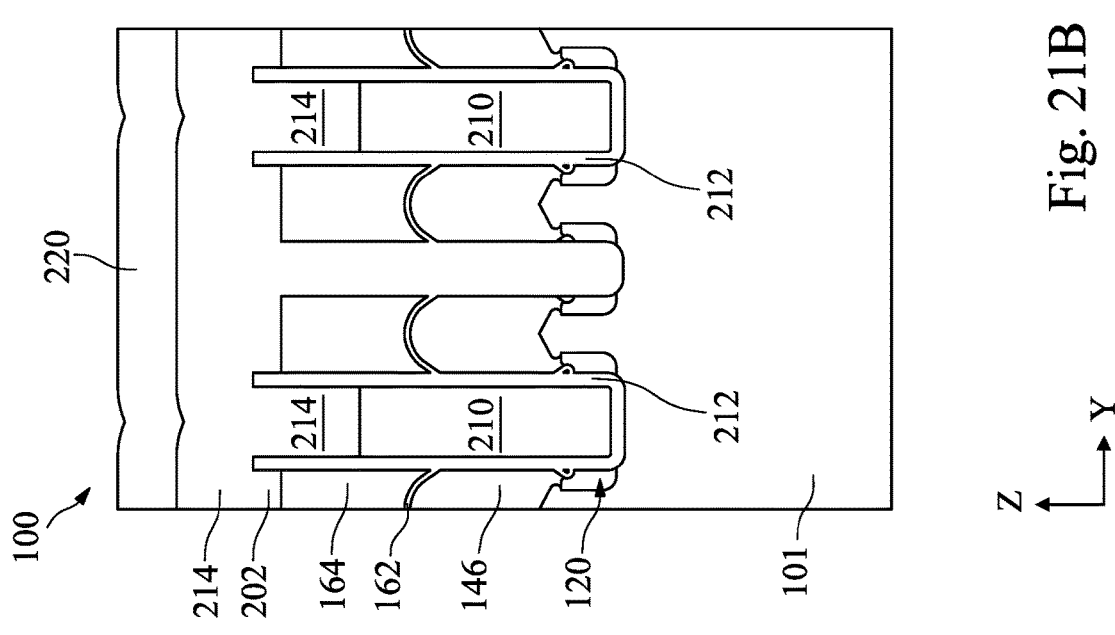

As shown in FIGS. 21A and 21B, a dielectric material 220 is formed in the opening 218. The dielectric material 220 may include any suitable dielectric material, such as SiN. In some embodiments, the dielectric material 220 includes the same material as the dielectric material 206. The processes for forming the dielectric materials 206 and the dielectric material 220 may be optional.

Figures 22A, 22B:
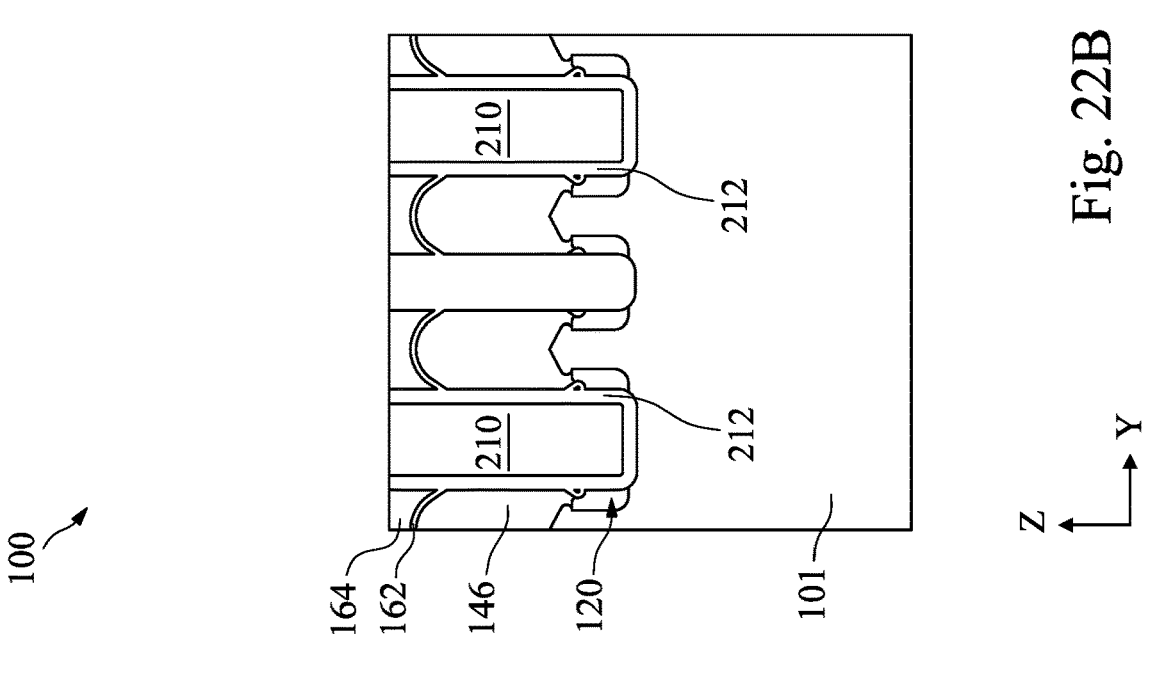

As shown in FIGS. 22A and 22B, the portion of the dielectric material 220 disposed on the dielectric material 214, the dielectric material 214, and the hard mask 202 are removed. In some embodiments, a planarization process, such as a CIVIP process, is performed to remove the above-mentioned materials. As a result, the semiconductor device structure 100 has a substantially planar top surface. As shown in FIG. 21A, at the current stage of manufacturing of the semiconductor device structure 100, the top surface of the semiconductor device structure 100 includes a top surface of each dielectric materials 206, a top surface of each conductive feature 210, a top surface of each gate electrode layer 172, a top surface of each gate spacer 138, a top surface of the dielectric material 220, and a top surface of the ILD layer 164. In other words, all the top surfaces of the dielectric materials 206, the dielectric material 220, the gate electrode layers 172, the gate spacers 138, the conductive features 210, and the ILD layer 164 are substantially coplanar. The gate dielectric layers 170, the liners 212, and the CESL 162 may also include top surfaces that are substantially coplanar with the above-mentioned top surfaces.

Figures 23A, 23B:
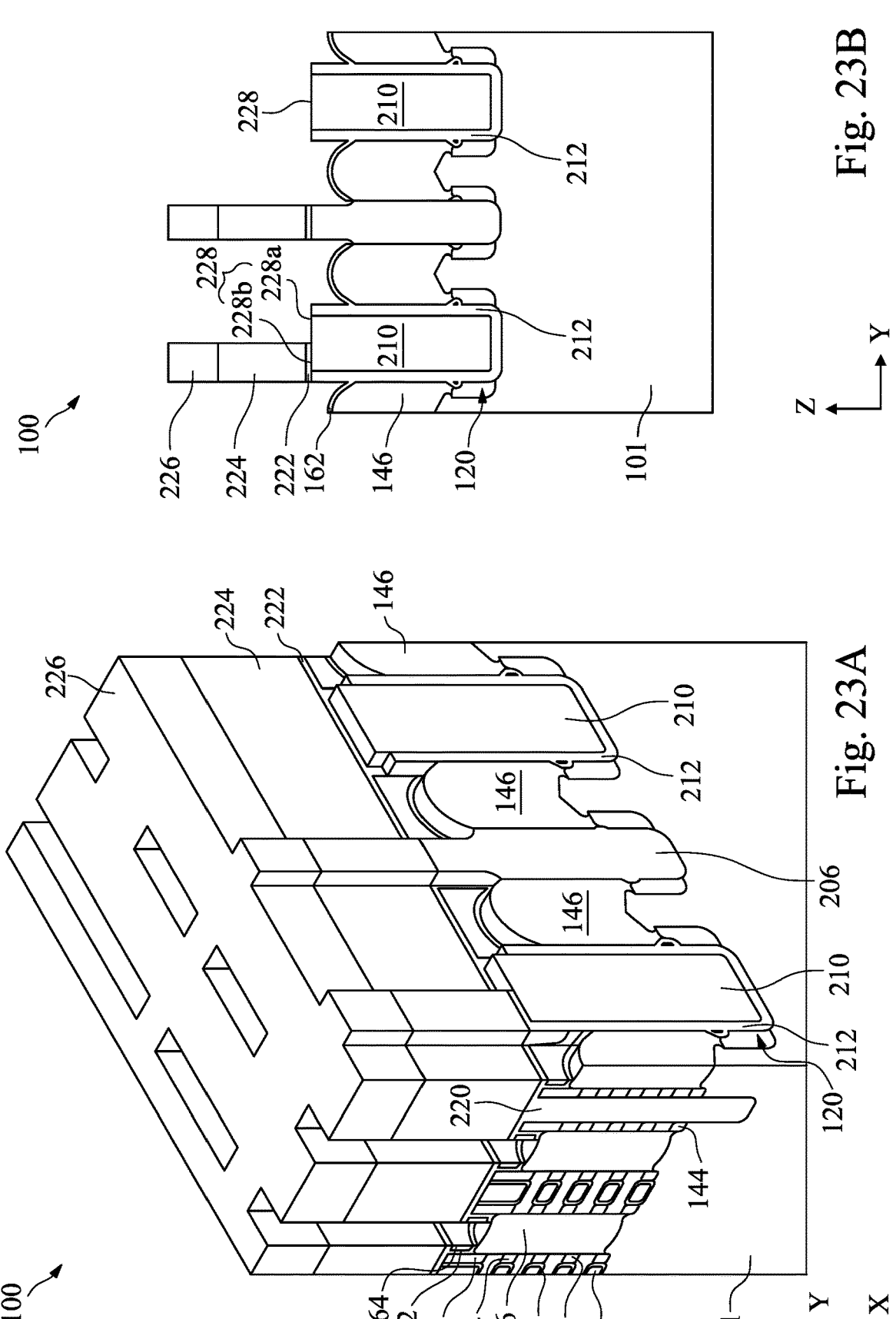

As shown in FIGS. 23A and 23B, an etch stop layer (ESL) 222 is formed on the top surface of the semiconductor device structure 100, another ILD layer 224 is formed on the ESL 222, and a hard mask 226 is formed on the ILD layer 224. The ESL 222 may include the same material as the CESL 162, and the ILD layer 224 may include the same material as the ILD layer 164. The hard mask 226 may include the same material as the hard mask 202. As shown in FIGS. 23A and 23B, portions of the hard mask 226, portions of the ESL 222, portions of the ILD layer 164 disposed over the S/D regions 146 are removed, exposing portions of the CESL 162 disposed on the S/D regions 146. The removal of the portions of the hard mask 226, the portions of the ESL 222, and the portions of the ILD layer 164 may be performed by any suitable process. In some embodiments, one or more etch processes are performed to remove the portions of the hard mask 226, the portions of the ILD layer 164, and the portions of the ESL 222.

In some embodiments, portions of the hard mask 226, portions of the ILD layer 224, and portions of the ESL 222 disposed over at least a portion of each of the conductive features 210 are also removed. As a result, at least a portion of each of the conductive feature 210 is exposed. For example, each conductive feature 210 includes a top surface 228, and the top surface 228 may be completely exposed or partially exposed. As shown in FIG. 23B, in some embodiments, one of the top surfaces 228 is completely exposed, while another top surface 228 includes a first portion 228*a* that is exposed and a second portion 228*b* that is covered by the ESL 222 and the ILD layer 224.

Figures 24A, 24B:
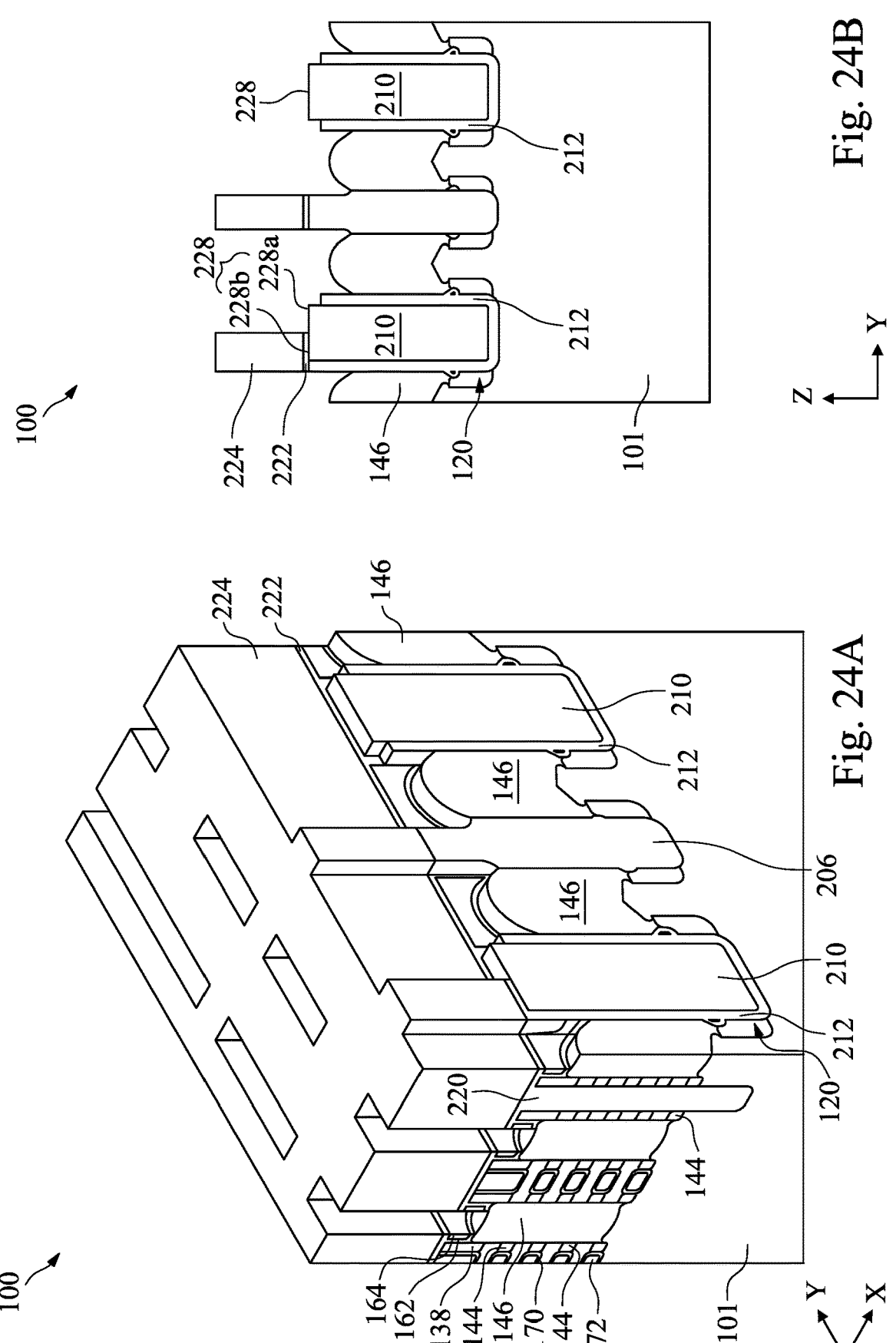

As shown in FIGS. 24A and 24B, the hard mask 226 and the exposed portions of the CESL 162 are removed. In some embodiments, the hard mask 226 and the CESL 162 include the same material, and an etch process is performed to remove the hard mask 226 and the exposed portions of the CESL 162. As a result, the S/D regions 146 are exposed. The gate structures 174 and the gate spacers 138 are covered by the ILD layer 224 during subsequent processes.

FIGS. 25A-36A are cross-sectional side views of various stages of manufacturing a PFET region 103P of the semiconductor device structure 100 taken along line C-C of FIG. 6, in accordance with some embodiments. FIGS. 25B-36B are cross-sectional side views of various stages of manufacturing an NFET region 103N of the semiconductor device structure 100 taken along line C-C of FIG. 6, in accordance with some embodiments.

Figure 25B:
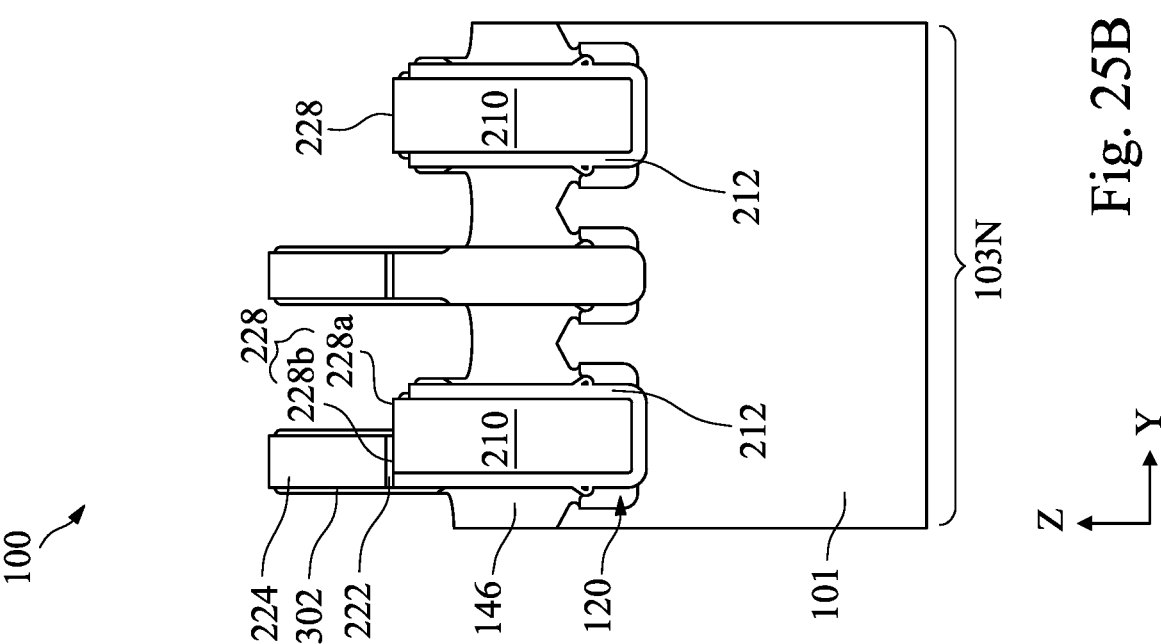
Figure 25A:
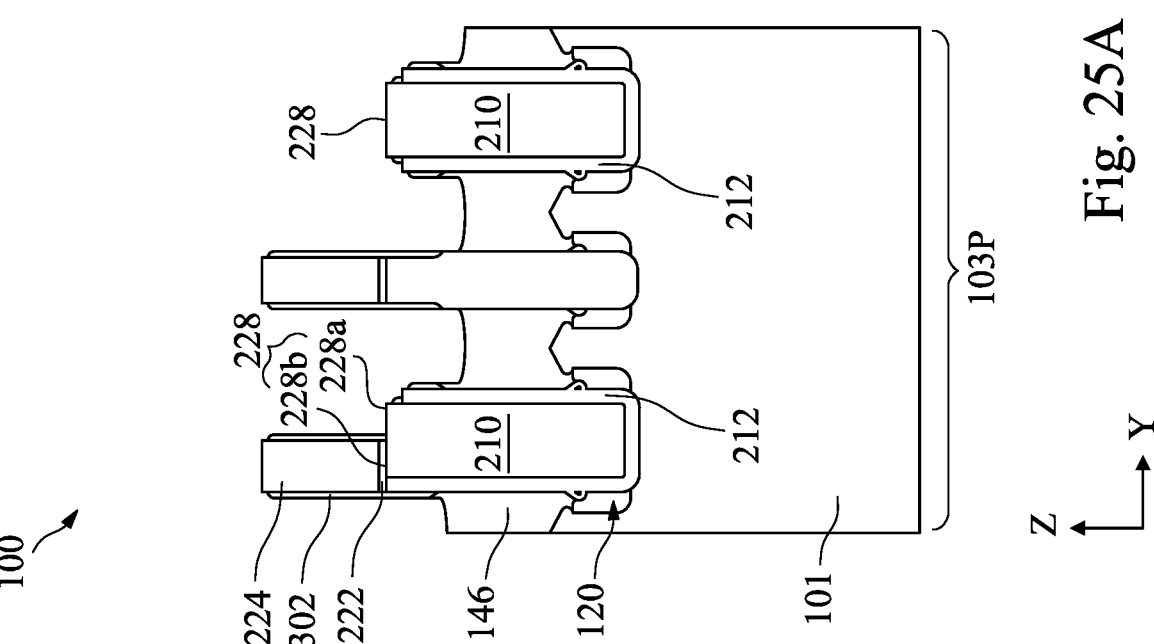

FIGS. 25A and 25B illustrate cross-sectional side views of the PFET region 103P and NFET region 103N, respectively, during one of various stages of manufacturing the semiconductor device structure 100. As shown in FIGS. 25A and 25B, the p-type S/D regions 146 are located in the PFET region 103P, and the n-type S/D regions 146 are located in the NFET region 103N. In some embodiments, the S/D regions 146 located in PFET region 103P include SiGe or SiGeB, and the S/D regions 146 located in NFET region 103N include SiP. Liners 302 are formed on the vertical surfaces of the semiconductor device structure 100 in the PFET region 103P and the NFET region 103N. For example, the liners 302 are formed on the side surfaces of the ILD layer 224, the ESL 222, and portions of the liners 212. The liners 302 may include any suitable dielectric material, such as SiN, SiCN, SiOCN, or SiOC. The liners 302 may be formed by any suitable process. In some embodiments, a conformal layer is first formed on the exposed surfaces of the semiconductor device structure 100, and an anisotropic etch process is performed to remove portions of the conformal layer formed on the horizontal surfaces of the semiconductor device structure 100 to form the liners 302. In some embodiments, a portion of each S/D region 146 is also removed by the anisotropic etch process, as shown in FIGS. 25A and 25B. The liners 302 are formed in the PFET region 103P and the NFET region 103N simultaneously. In some embodiments, the liner 302 has a thickness ranging from about 1 nm to about 4 nm.

Figure 26B:
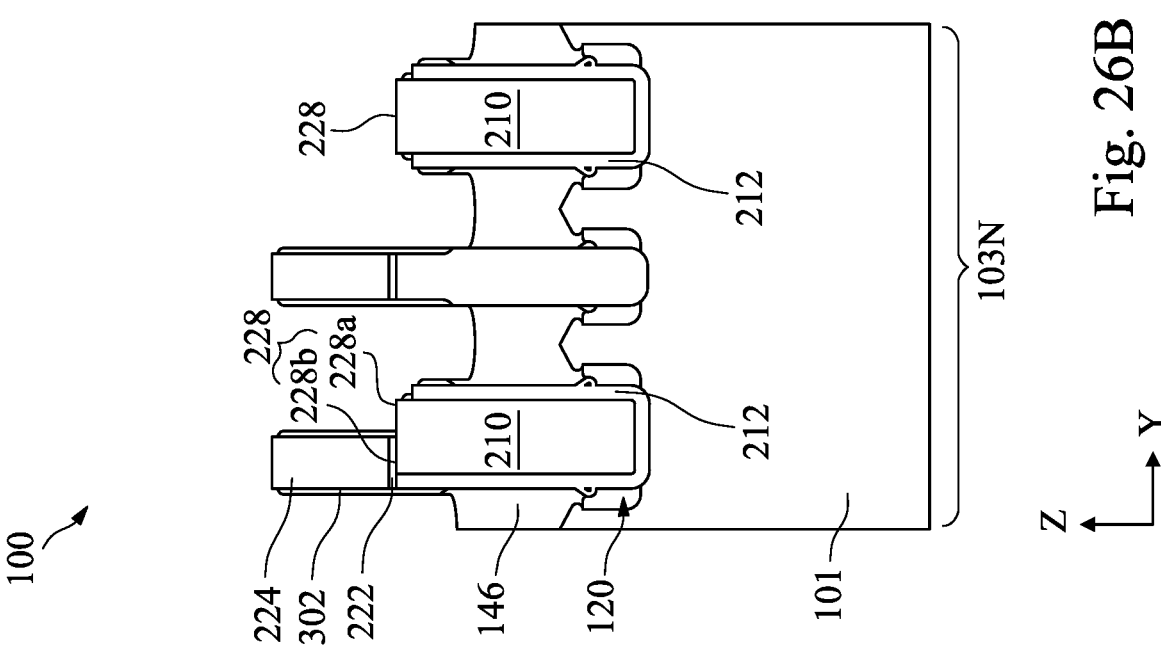
Figure 26A:
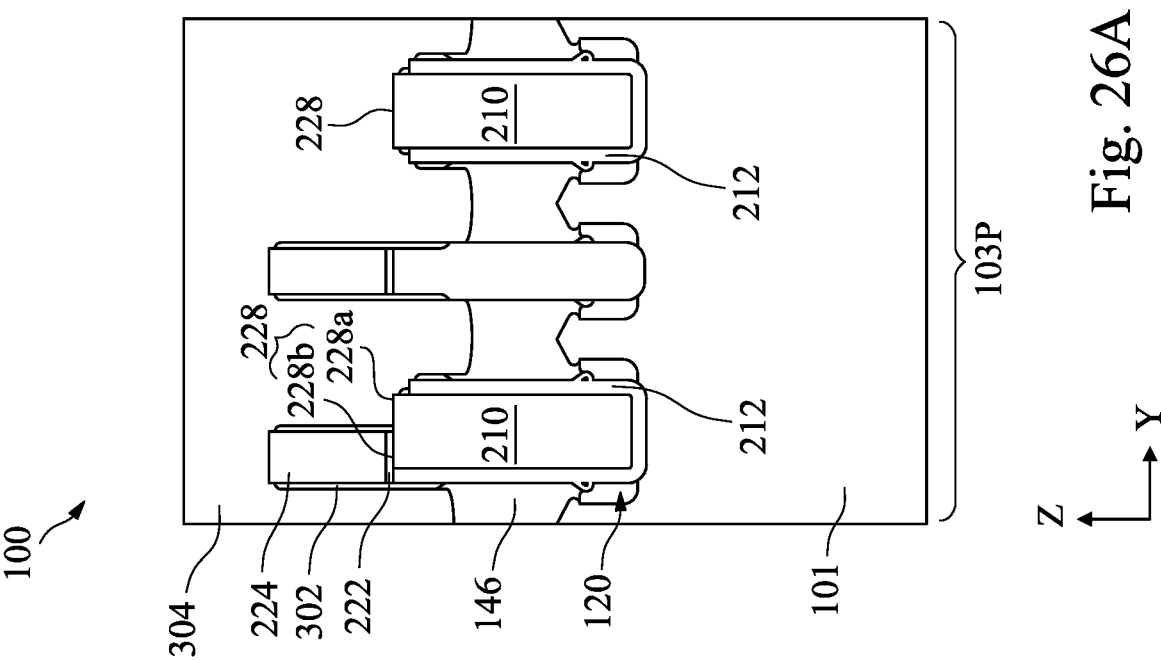

FIGS. 26A and 26B illustrate cross-sectional side views of the PFET region 103P and NFET region 103N, respectively, during one of various stages of manufacturing the semiconductor device structure 100. As shown in FIGS. 26A and 26B, a mask 304 is formed in the PFET region 103P to cover the materials in the PFET region 103P. The mask 304 is patterned and does not cover the materials of the NFET region 103N. The materials of the NFET region 103N are exposed. The mask 304 may be any suitable material. In some embodiments, the mask 304 is a bottom antireflective coating (BARC) layer. In some embodiment, the mask 304 is a photoresist, such as a tri-layer photoresist.

Figure 27A:
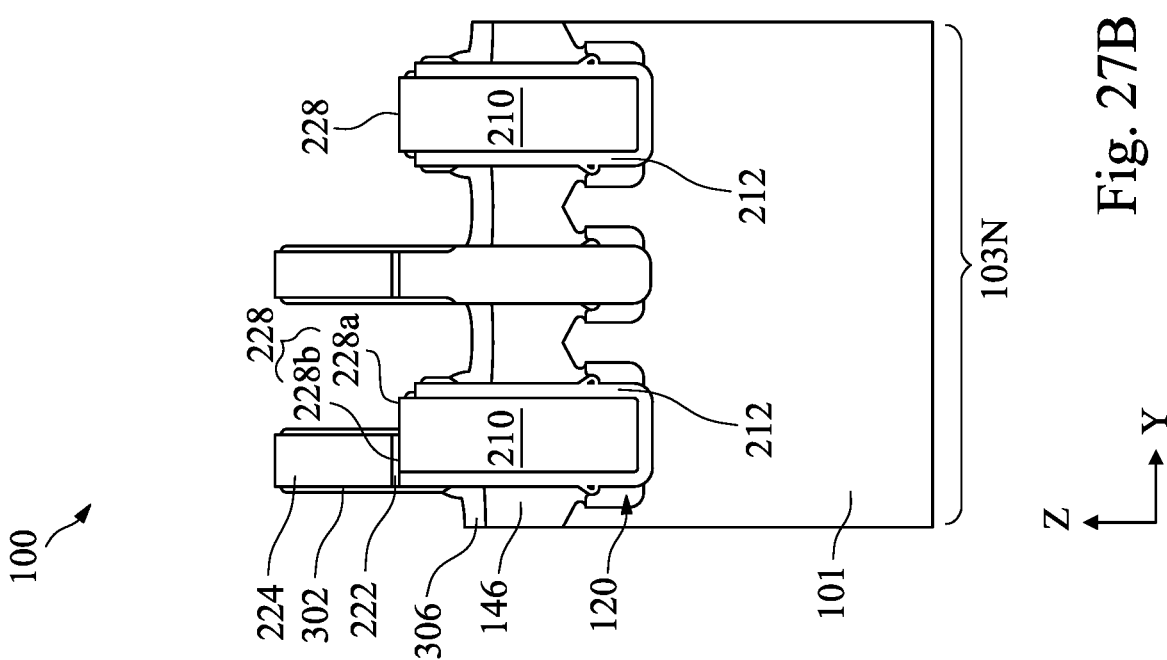
Figure 27B:
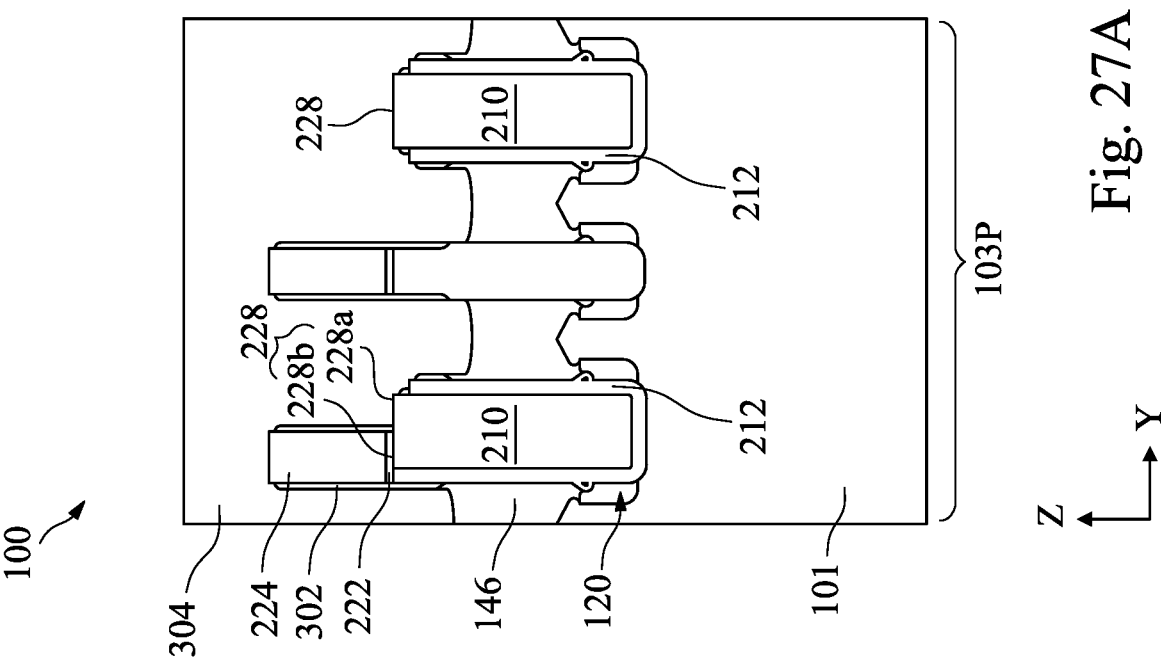

FIGS. 27A and 27B illustrate cross-sectional side views of the PFET region 103P and NFET region 103N, respectively, during one of various stages of manufacturing the semiconductor device structure 100. As shown in FIGS. 27A and 27B, an implantation process is performed to form a dipole region 306 in each exposed S/D region 146 in the NFET region 103N. One or more dipole dopants, for example a metal or metals, such as Zr, Hf, Sb, Ce, Sc, Y, Yb, or Er, are implanted into a top portion of each S/D region 146 to form the dipole regions 306. In some embodiments, the dipole dopants may be a transition metal or a lanthanide series metal. In some embodiments, the dipole dopants may be also implanted into the exposed portions of the conductive features 210 and the exposed portions of the ILD layer 224. As a result, the conductive features 210 located in the NFET region 103N includes dopants such as Zr, Hf, Sb, Ce, Sc, Y, Yb, or Er, while the conductive features 210 located in the PFET region 103P are free of the dopants. The implantation process is one of various methods for forming the dipole regions 306. Other suitable method may be utilized to form the dipole regions 306.

Figure 28B:
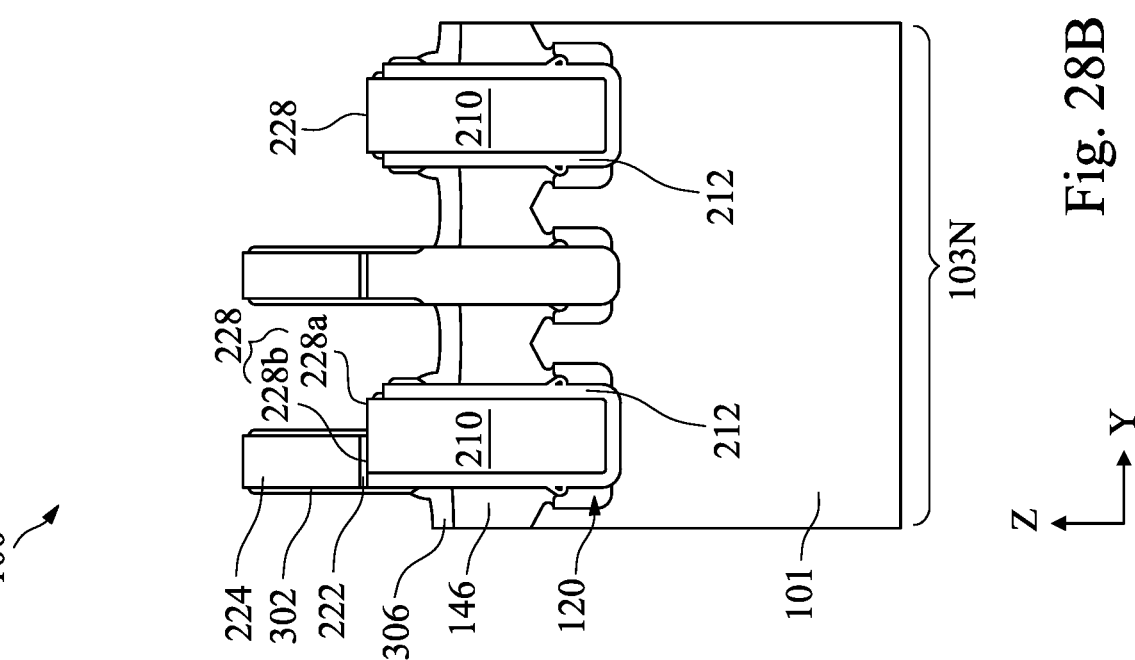
Figure 28A:
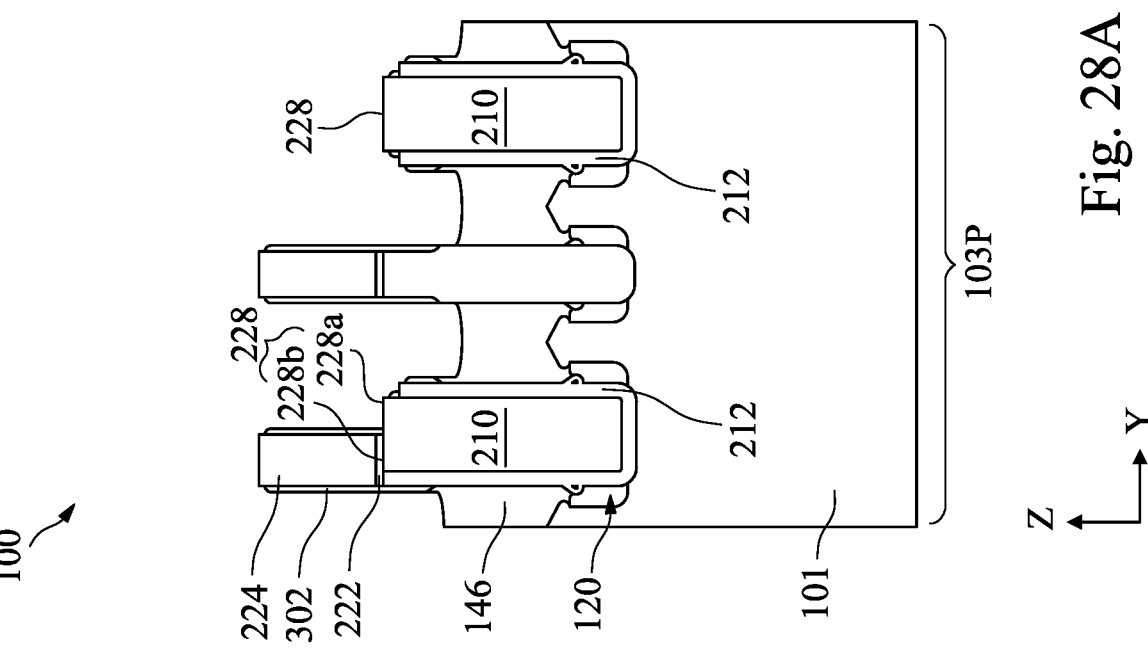

FIGS. 28A and 28B illustrate cross-sectional side views of the PFET region 103P and NFET region 103N, respectively, during one of various stages of manufacturing the semiconductor device structure 100. As shown in FIGS. 28A and 28B, the mask 304 is removed. The mask 304 may be removed by any suitable process. In some embodiments, the mask 304 is removed by a selective process that does not substantially affect the exposed materials in the NFET region 103N. As a result, the S/D regions 146 in the PFET region 103P are exposed, and the dipole regions 306 of the S/D regions 146 in the NFET region 103N are exposed.

Figure 29B:
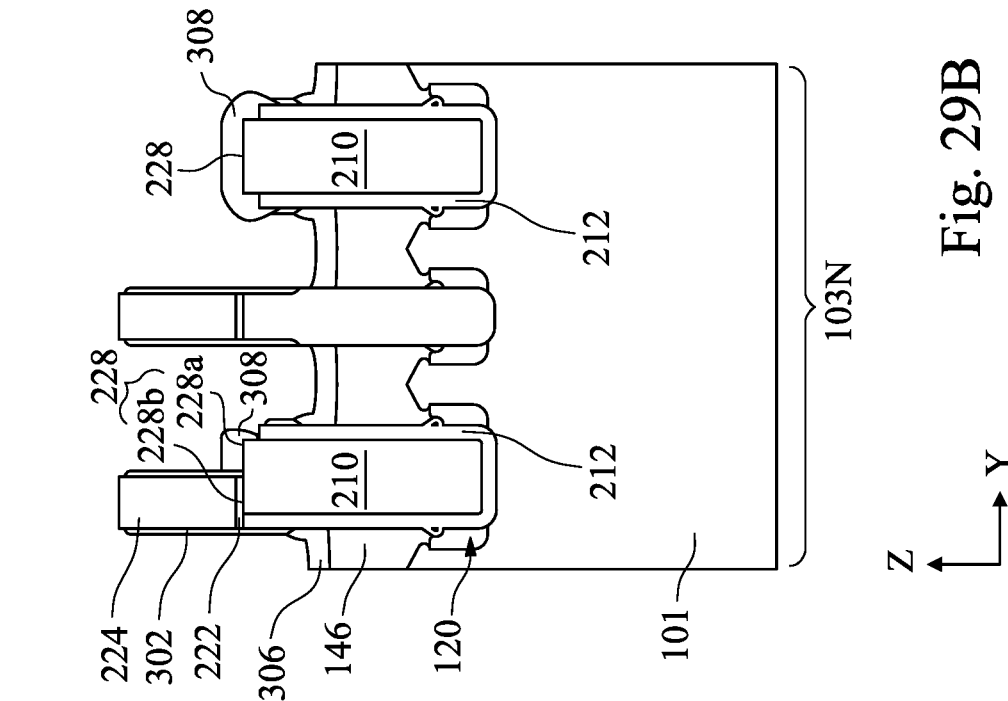
Figure 29A:
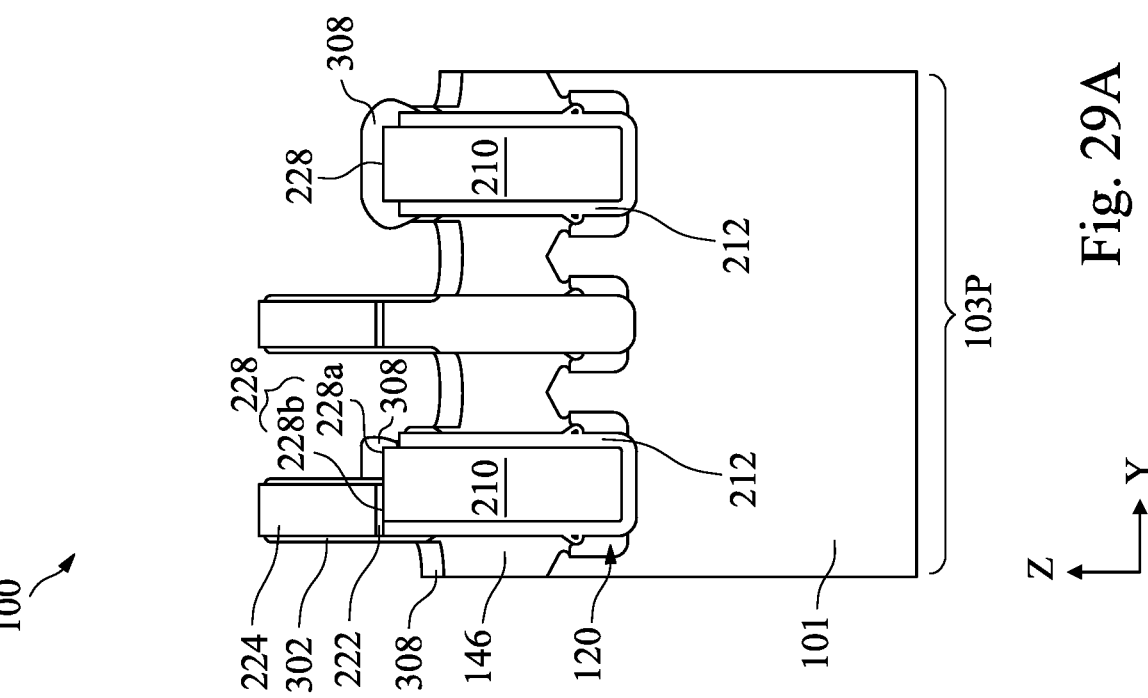

FIGS. 29A and 29B illustrate cross-sectional side views of the PFET region 103P and NFET region 103N, respectively, during one of various stages of manufacturing the semiconductor device structure 100. As shown in FIGS. 29A and 29B, metal layers 308 are selectively formed on the conductive features 210 and the S/D regions 146 in the PFET region 103P. Each metal layer 308 includes Mo, Ru, Ni, Co, or other suitable metal. In some embodiments, the S/D regions 146 in the PFET region 103P includes SiGe, which has crystal structures similar to that of a metal. Thus, the metal layers 308 can be selectively formed on the SiGe of the S/D regions 146 in the PFET region 103P and the metal surfaces of the conductive features 210. The S/D regions 146 in the NFET region 103N includes Si, and the metal layers 308 are not formed on the S/D regions 146 in the NFET region 103N, even with the dipole regions 306 (dopant concentration not high enough for the metal layers 308 to be formed thereon). In some embodiments, the precursors of the metal layers 308 include a halide, such as a chloride, which etches the portions of the metal layers 308 formed on the dielectric materials and semiconductor materials (except SiGe) at a much faster rate than the portions of the metal layers 308 formed on the metallic materials and SiGe. In some embodiments, a ligand is used in a CVD process in addition to the precursors for forming the metal layers 308, and the ligand prevents the metal layers 308 from forming on the dielectric materials and semiconductor materials (except SiGe). The metal layers 308 may be selective formed by any suitable method.

Figure 30B:
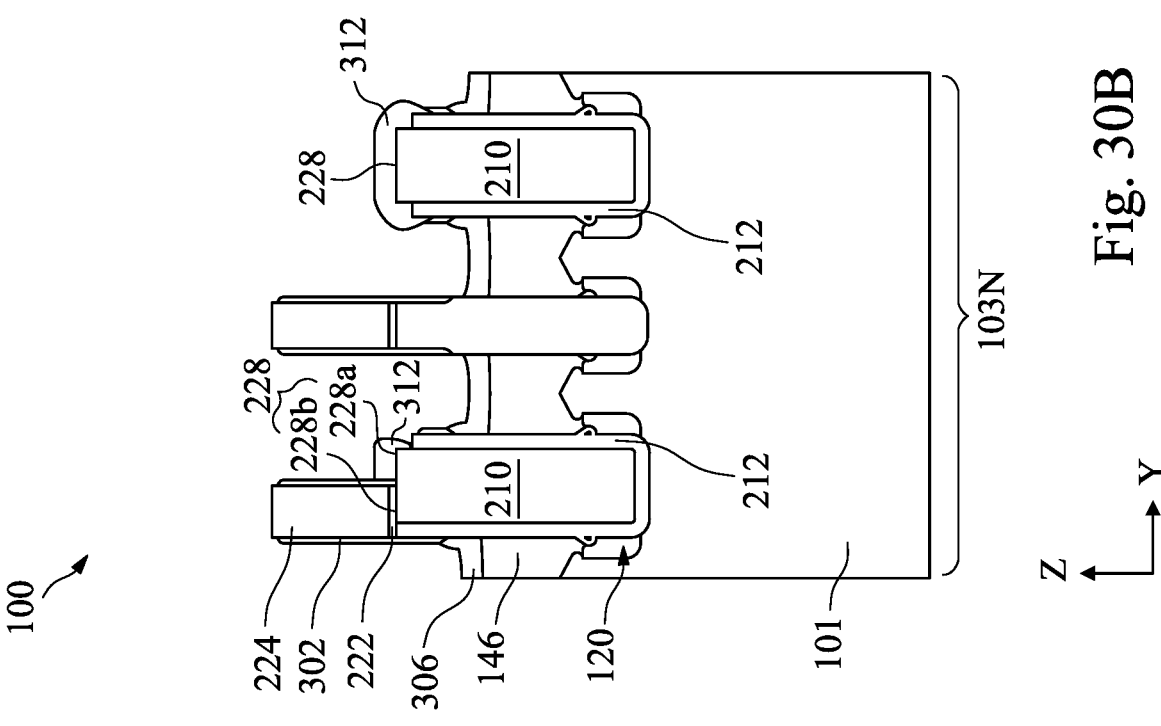
Figure 30A:
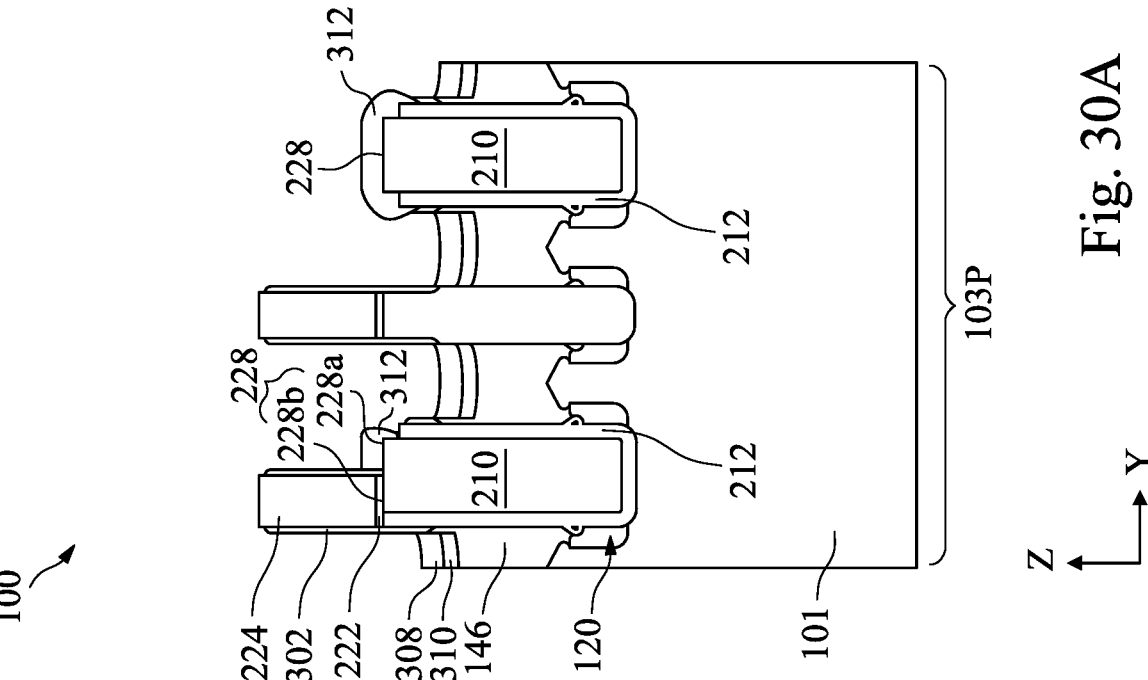

FIGS. 30A and 30B illustrate cross-sectional side views of the PFET region 103P and NFET region 103N, respectively, during one of various stages of manufacturing the semiconductor device structure 100. As shown in FIGS. 30A and 30B, an anneal process is performed on the semiconductor device structure 100. As a result, silicide layers 310 are formed on the S/D regions 146 in the PFET region 103P, and alloy layers 312 are formed on the conductive features 210 in the PFET region 103P and in the NFET region 103N. A portion of each metal layer 308 reacts with the corresponding S/D region 146 during the anneal process, and the silicide layer 310 is the result of the reaction between the portion of each metal layer 308 and the corresponding S/D region 146. In some embodiments, a portion of each metal layer 308 is not reacted and remains on the corresponding silicide layer 310. Each silicide layer 310 includes a metal SiGe, such as MoSiGe, RuSiGe, NiSiGe, CoSiGe, or other suitable material. The thickness of each silicide layer 310 may range from about 1 nm to about 5 nm.

In some embodiments, the metal layers 308 include a material different from the conductive features 210. As a result of the anneal process, the alloy layers 312 are formed. The alloy layer 312 may include a binary metal alloy, such as MoCo, MoRu, MoW, RuCo, RuW, NiCo, NiRu, NiW, NiMo, CoW, or other suitable material. In some embodiments, the metal layers 308 include the same material as the conductive features 210, and the metal layers 308 are not affected by the anneal process and remain on the conductive features 210. The alloy layer 312 has a thickness ranging from about 1 nm to about 5 nm.

Figure 31B:
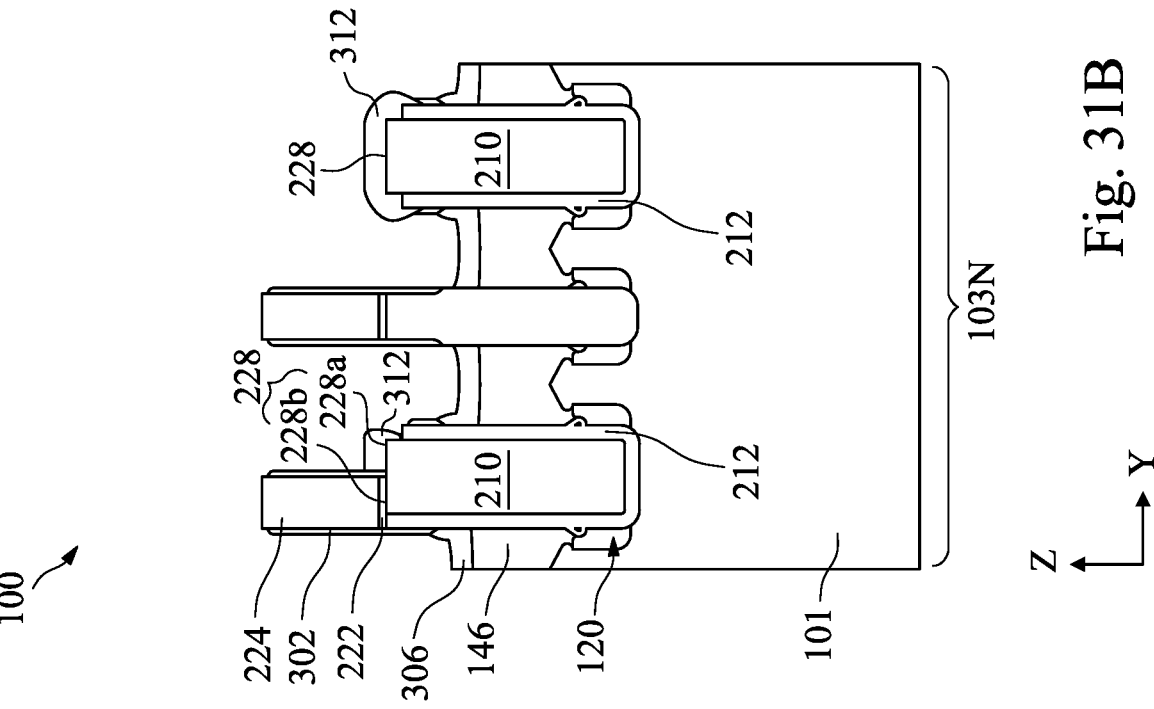
Figure 31A:
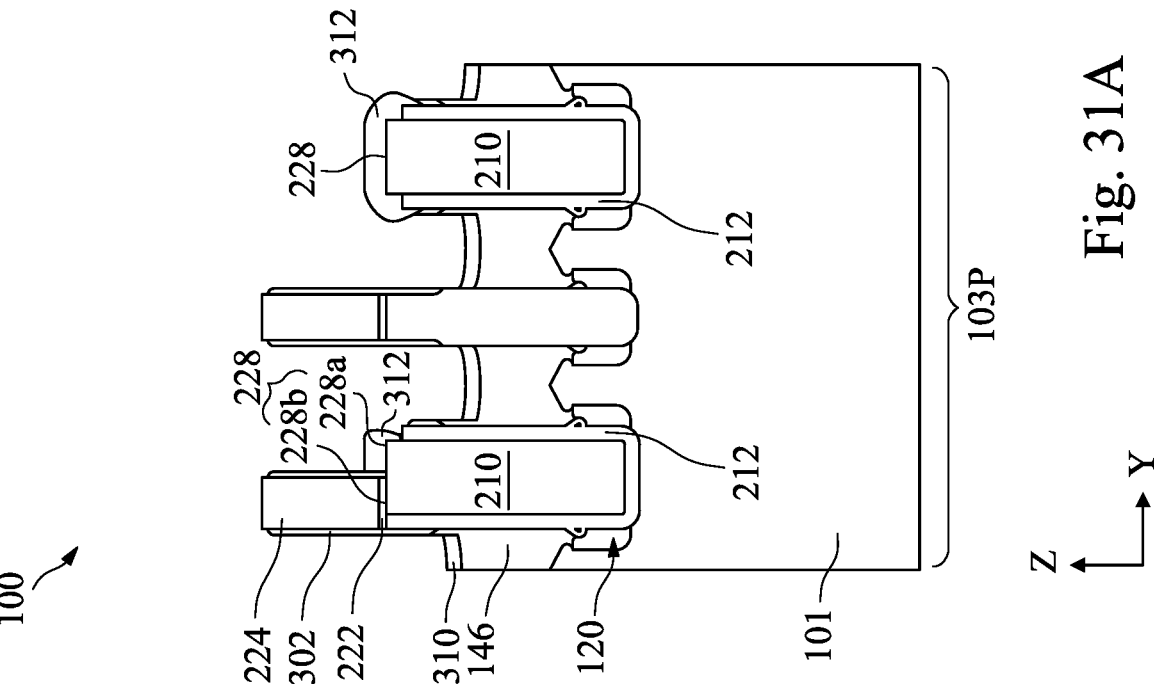

FIGS. 31A and 31B illustrate cross-sectional side views of the PFET region 103P and NFET region 103N, respectively, during one of various stages of manufacturing the semiconductor device structure 100. As shown in FIGS. 31A and 31B, unreacted portions of the metal layers 308 are selectively removed in the PFET region 103P. The metal layers 308 may be removed by any suitable process, such as a selective etch process. The selective etch process does not substantially affect the ILD layers 224, the liners 302, the alloy layers 312, the silicide layers 310, and the dipole regions 306 of the S/D regions 146 in the NFET region 103N. In some embodiments, the metal layers 308 include the same material as the conductive features 210, and the metal layers 308 are disposed on the conductive features 210 instead of the alloy layers 312. In such embodiments, the metal layers 308 disposed on the conductive features 210 are also removed. In some embodiments, as shown in FIGS. 31A and 31B, the alloy layer 312 is disposed on the first portion 228a of the top surface 228 of one of the conductive features 210, and the ESL 222 and the ILD layer 224 are disposed on the second portion 228b of the top surface 228 of the conductive feature 210.

Figure 32B:
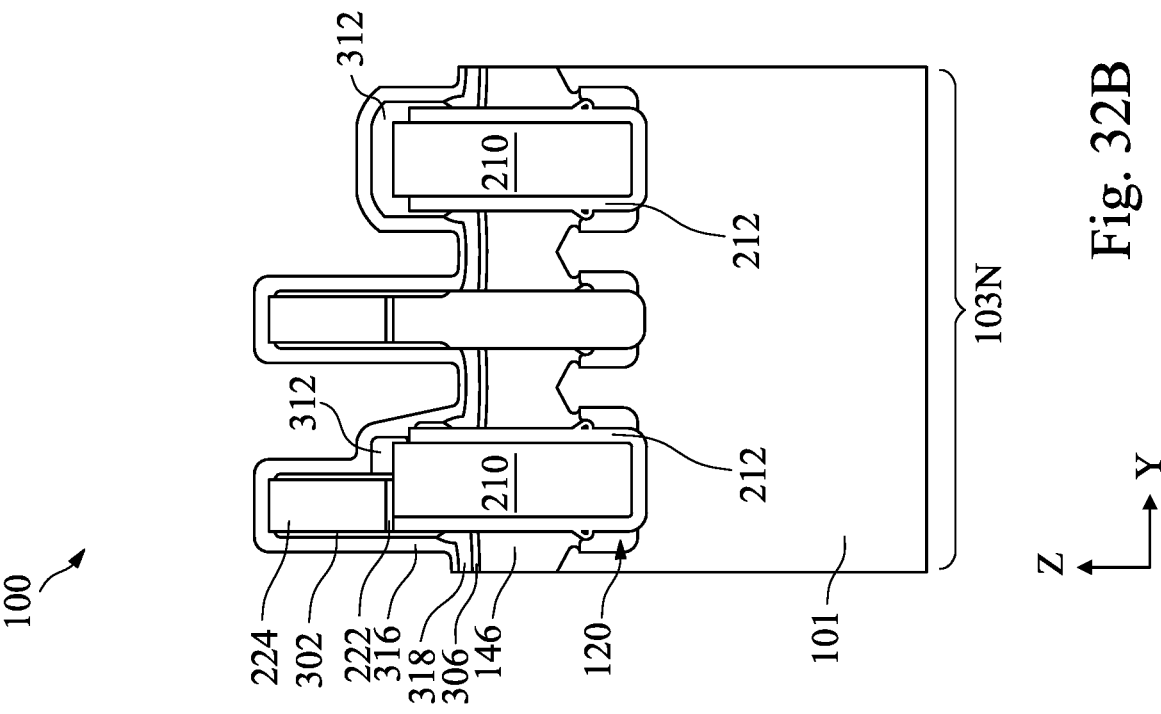
Figure 32A:
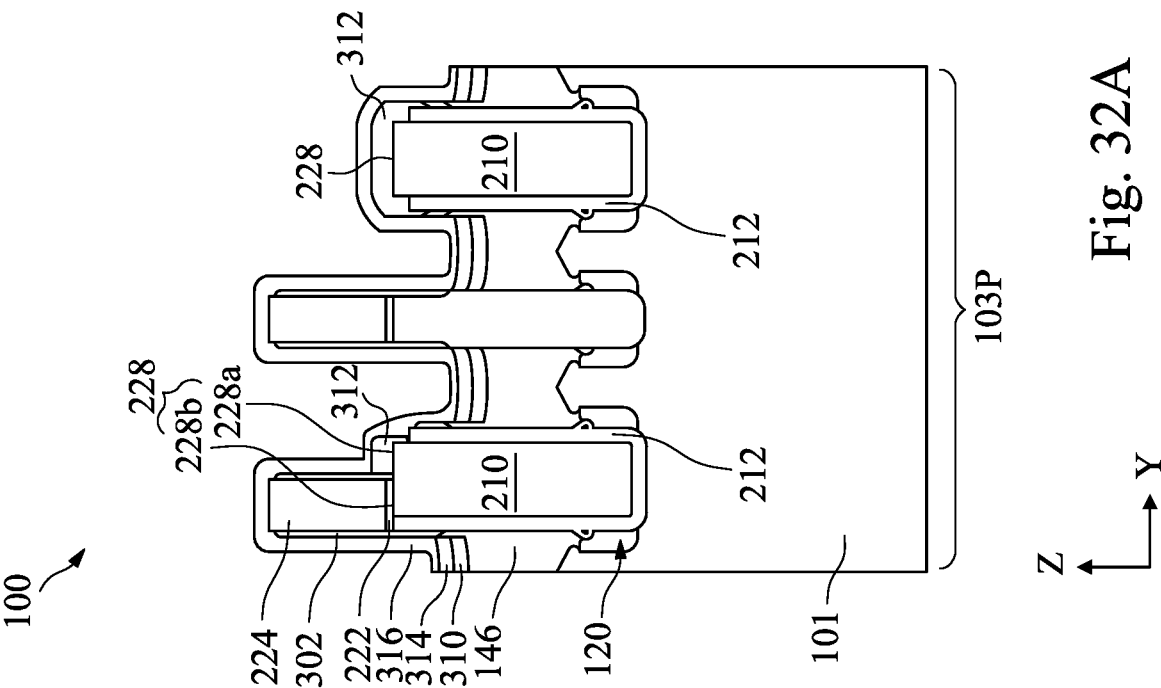

FIGS. 32A and 32B illustrate cross-sectional side views of the PFET region 103P and NFET region 103N, respectively, during one of various stages of manufacturing the semiconductor device structure 100. As shown in FIGS. 32A and 32B, silicide layers 314 are formed on corresponding silicide layers 310 in the PFET region 103P, silicide layers 318 are formed on corresponding dipole regions 306 in the NFET region 103N, and a nitride layer 316 is formed on the exposed surfaces in the PFET region 103P and the NFET region 103N. The silicide layers 314, 318 and the nitride layer 316 may be formed by any suitable processes. In some embodiments, a metal conformal layer is first formed on the exposed surfaces in the PFET region 103P and the NFET region 103N. The portions of the metal conformal layer in contact with the silicide layer 310 react with the silicide layer 310 to form the silicide layers 314. The portions of the metal conformal layer in contact with the dipole regions 306 reacts with the dipole regions 306 to form the silicide layers 318. As a result, the silicide layers 314, 318 are formed simultaneously. Subsequently, a nitridation process may be performed to convert the remaining portions of the metal conformal layer to the nitride layer 316. In some embodiments, the metal conformal layer includes Ti, the silicide layer 314 includes MoTiSiGe, RuTiSiGe, NiTiSiGe, CoTiSiGe, or other suitable material, the silicide layer 318 includes TiSi or other suitable material, and the nitride layer 316 includes TiSiN. In some embodiments, the silicide layer 310, the silicide layer 314, and the silicide layer 318 include different materials. The term "different materials" may be used herein to also include same material with different compositions. In some embodiments, the silicide layer 314 has a thickness ranging from about 1 nm to about 5 nm, and the silicide layer 318 has a thickness ranging from about 1 nm to about 5 nm. The nitride layer 316 has a thickness on vertical surfaces ranging from about 0.5 nm to about 4 nm, and the nitride layer 310 has a thickness on horizontal surfaces ranging from about 1 nm to about 5 nm. For example, the portions of the nitride layer 316 formed on the side surfaces of the liners 302 have a thickness ranging from about 0.5 nm to about 4 nm, and the portions of the nitride layer 316 formed on the silicide layers 314, 318 have a thickness ranging from about 1 nm to about 5 nm.

Figure 33B:
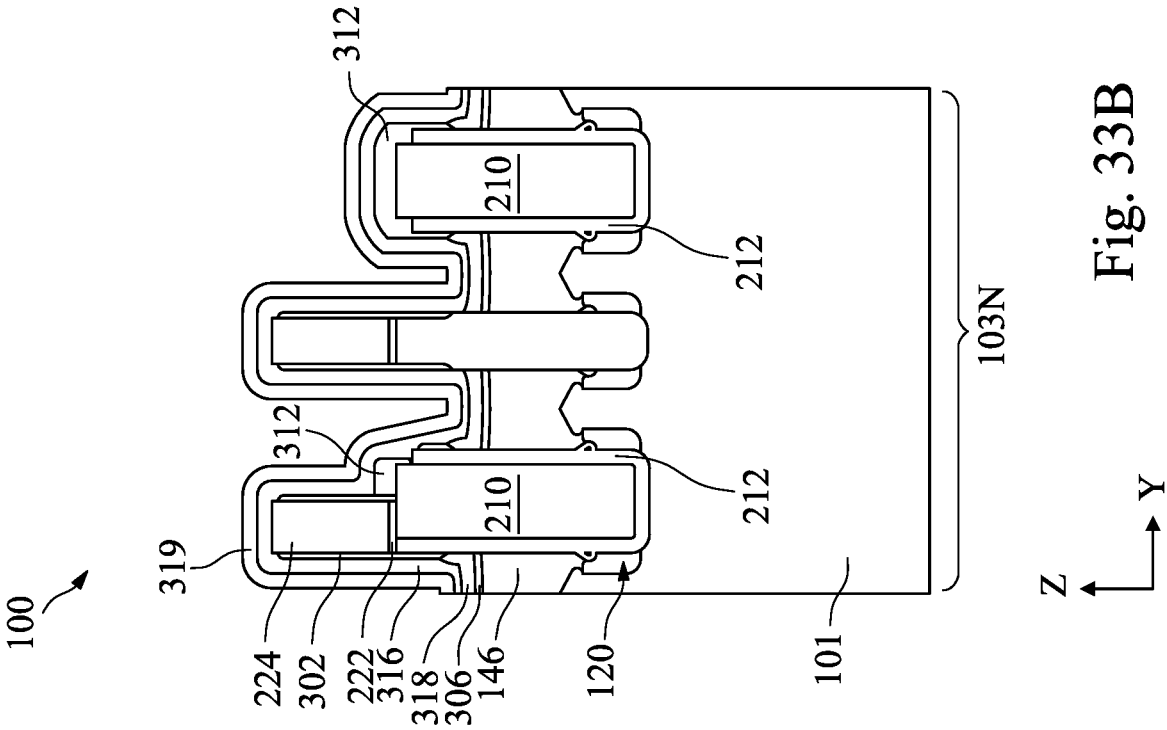
Figure 33A:
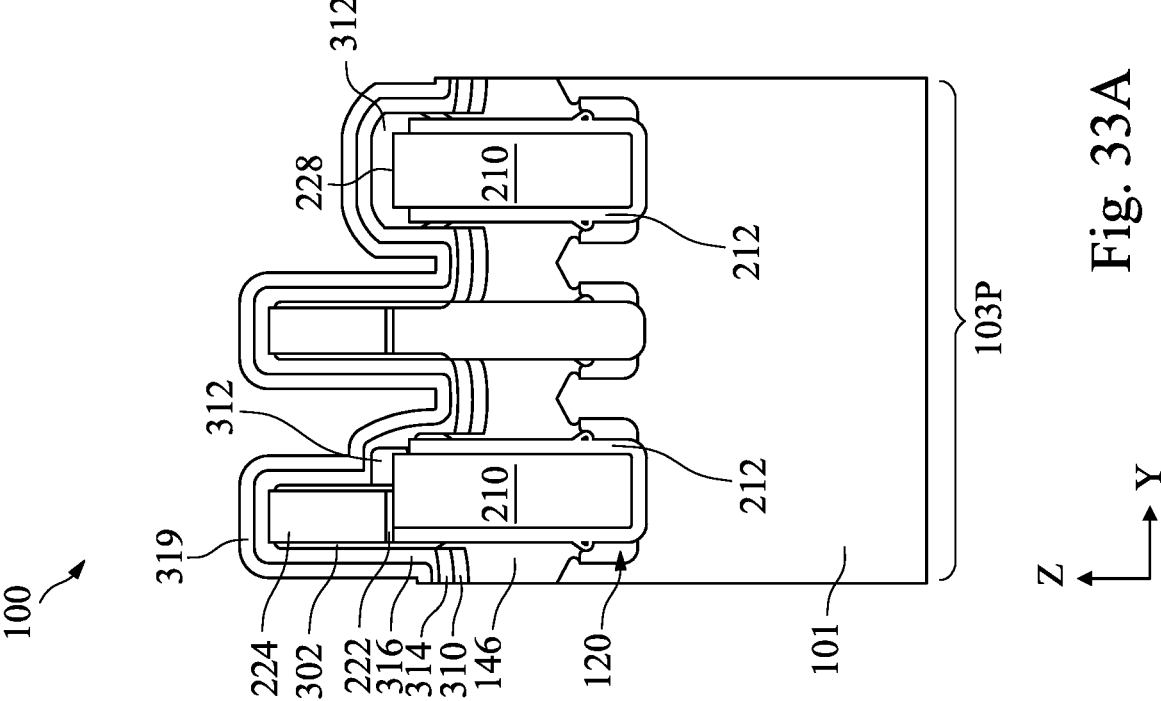

FIGS. 33A and 33B illustrate cross-sectional side views of the PFET region 103P and NFET region 103N, respectively, during one of various stages of manufacturing the semiconductor device structure 100. As shown in FIGS. 33A and 33B, an optional barrier layer 319 is formed on the exposed surfaces in the PFET region 103P and in the NFET region 103N. The optional barrier layer 319 includes TiN, TaN, or other suitable material. The optional barrier layer 319 may have a thickness ranging from about 0.3 nm to about 3 nm.

Figures 34A, 34B:
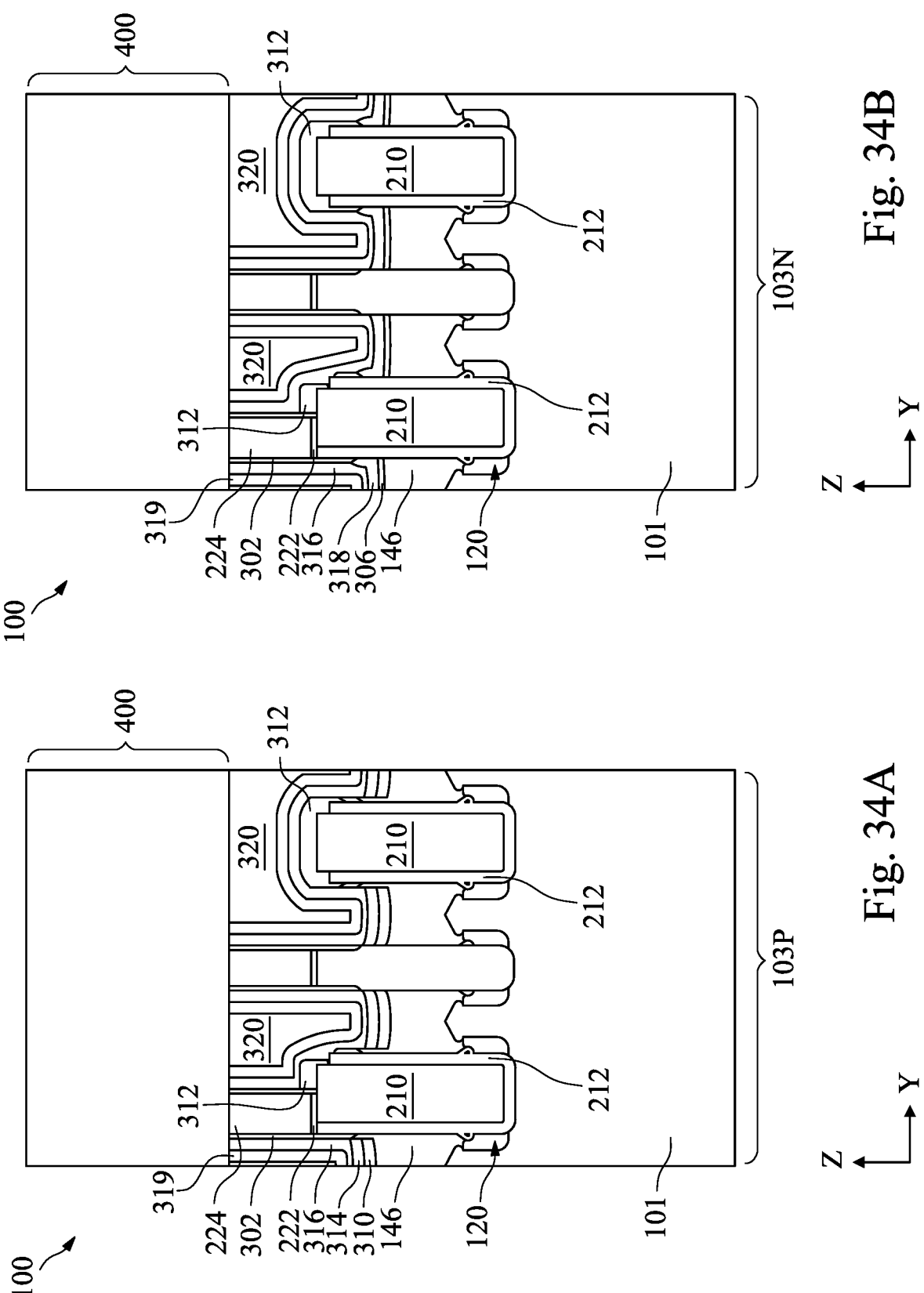

FIGS. 34A and 34B illustrate cross-sectional side views of the PFET region 103P and NFET region 103N, respectively, during one of various stages of manufacturing the semiconductor device structure 100. As shown in FIGS. 34A and 34B, conductive features 320 are formed on the optional barrier layer 319. The conductive features 320 may be formed by first forming a conductive material on the optional barrier layer 319, followed by a planarization process to expose the ILD layers 224. As a result, multiple conductive features 320 are separated by the ILD layers 224. The conductive features 320 include an electrically conductive material, such as a metal. In some embodiments, the conductive features 320 include Mo, Co, Ru, W, Cu, or other suitable material. After the planarization process, the conductive feature 320 may have a height ranging from about 10 nm to about 50 nm. The conductive features 320 are electrically connected to the S/D regions 146 in both PFET region 103P and the NFET region 103N. By forming the silicide layers 310, 314 in the PFET region 103P and the dipole regions 306 and the silicide layers 318 different from the silicide layers 310, 314 in the NFET region 103N, the source/drain contact resistance is substantially reduced as a result of the reduced Schottky barrier height. The conductive features 320 are also electrically connected to the conductive features 210, as shown in FIGS. 34A and 34B.

It is understood that the semiconductor device structure 100 may undergo further back-end-of-line (BEOL) processes to form an interconnect structure 400 including conductive lines, conductive vias, dielectric layers, passivation layers, etc. After the BEOL processes, the semiconductor device structure 100 is flipped over for backside processing.

FIGS. 35A and 35B illustrate cross-sectional side views of the PFET region 103P and NFET region 103N, respectively, during one of various stages of manufacturing the semiconductor device structure 100. As shown in FIGS. 35A and 35B, the semiconductor device structure 100 is flipped over, and the substrate 101 is thinned down or removed to expose the back surfaces of the conductive features 210.

Figures 36A, 36B:
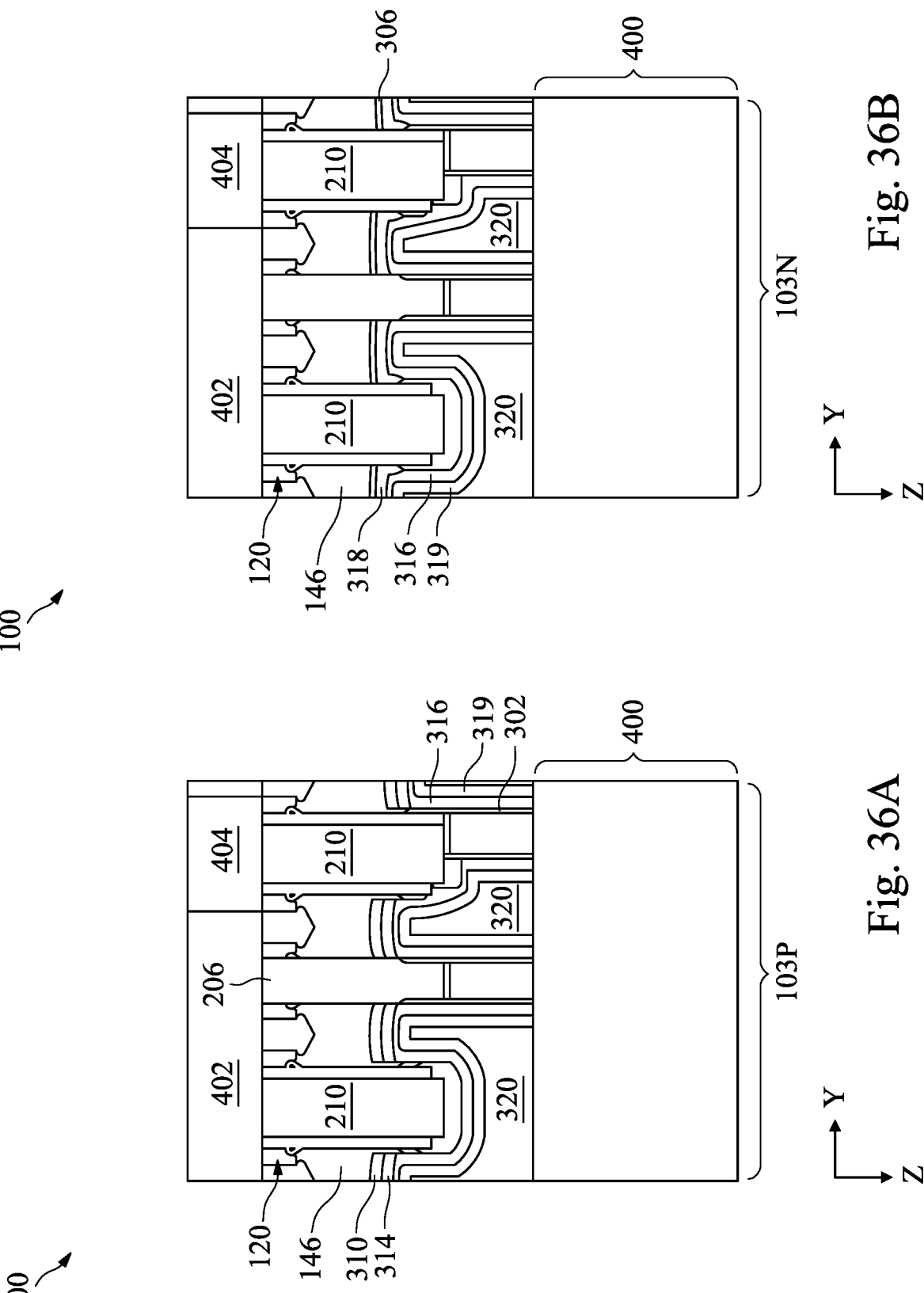

FIGS. 36A and 36B illustrate cross-sectional side views of the PFET region 103P and NFET region 103N, respectively, during one of various stages of manufacturing the semiconductor device structure 100. As shown in FIGS. 36A and 36B, a dielectric layer 402 is formed on the backside of the semiconductor device structure 100, and conductive features 404 are formed in the dielectric layer 402. The dielectric layer 402 may include the same material as the ILD layer 164, and the conductive features 404 may include any suitable electrically conductive material, such as a metal. In some embodiments, the conductive features 404 include Cu, W, Mo, Ru, Ti, TiN, Co. In some embodiments, a barrier layer (not shown) may be formed in the dielectric layer 402, and the conductive feature 404 is formed on the barrier layer. The conductive features 404 are electrically connected to the S/D regions 146 via the conductive features 320, 210, and the conductive features 404 are utilized to supply power to the S/D regions 146. As a result, device performance is improved, and front side conductive feature routing complexity is relaxed.

In some embodiments, the conductive features 404 and the conductive features 210 may intermix with each other as a result of metal diffusion, which causes metal voids and reliability issues. FIGS. 37A to 45B illustrate methods to substantially reduce the intermixing between the conductive features 404 and the conductive features 210.

FIGS. 37A-45A are perspective views of various stages of manufacturing the semiconductor device structure 100, in accordance with alternative embodiments. FIGS. 37B-45B are cross-sectional side views of various stages of manufacturing the semiconductor device structure 100 taken along line C-C of FIG. 6, in accordance with alternative embodiments. Furthermore, FIGS. 37B-45B are cross-sectional views of the Z-Y plane of FIGS. 37A-45A, respectively.

Figures 37A, 37B:
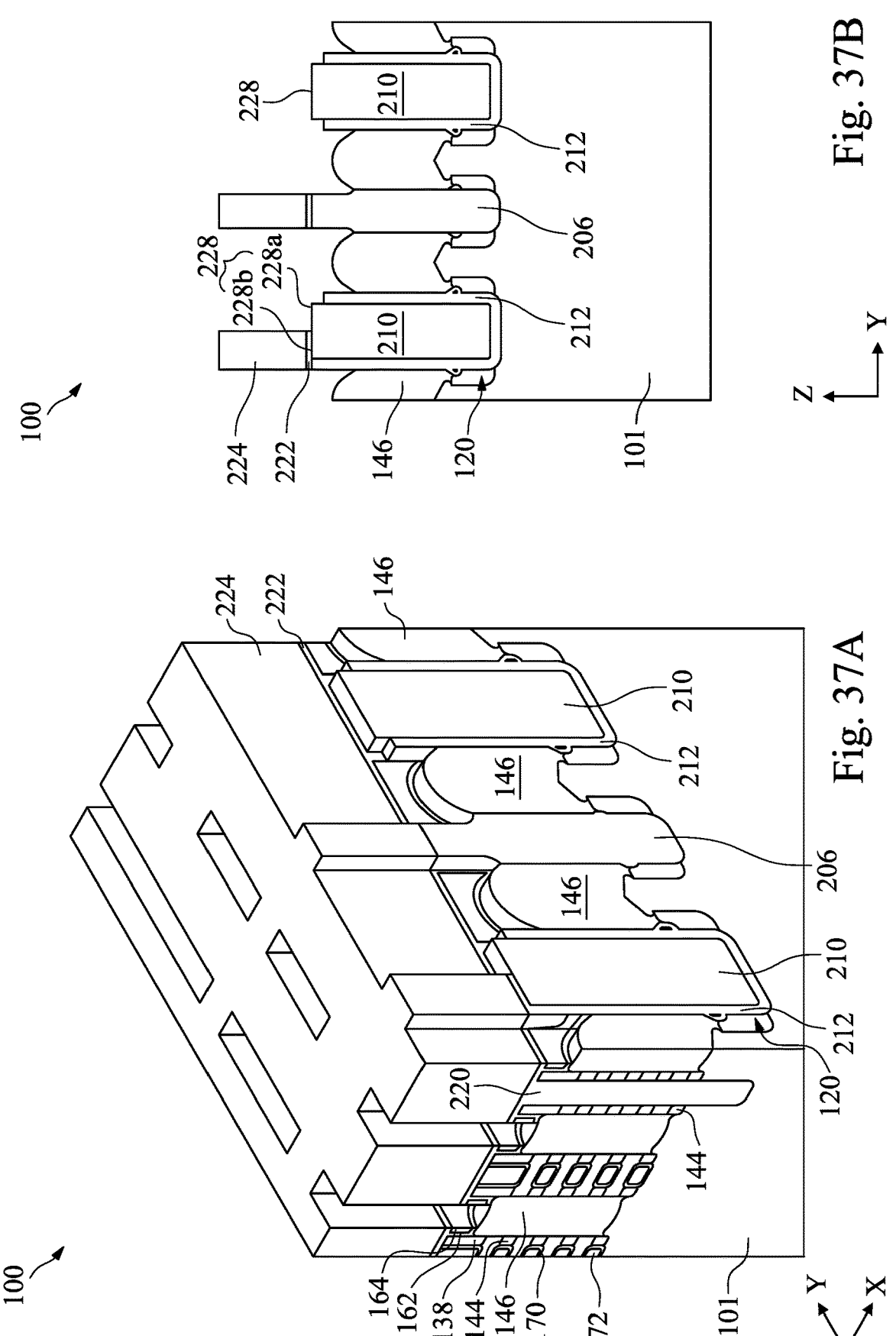
Figures 38A, 38B:
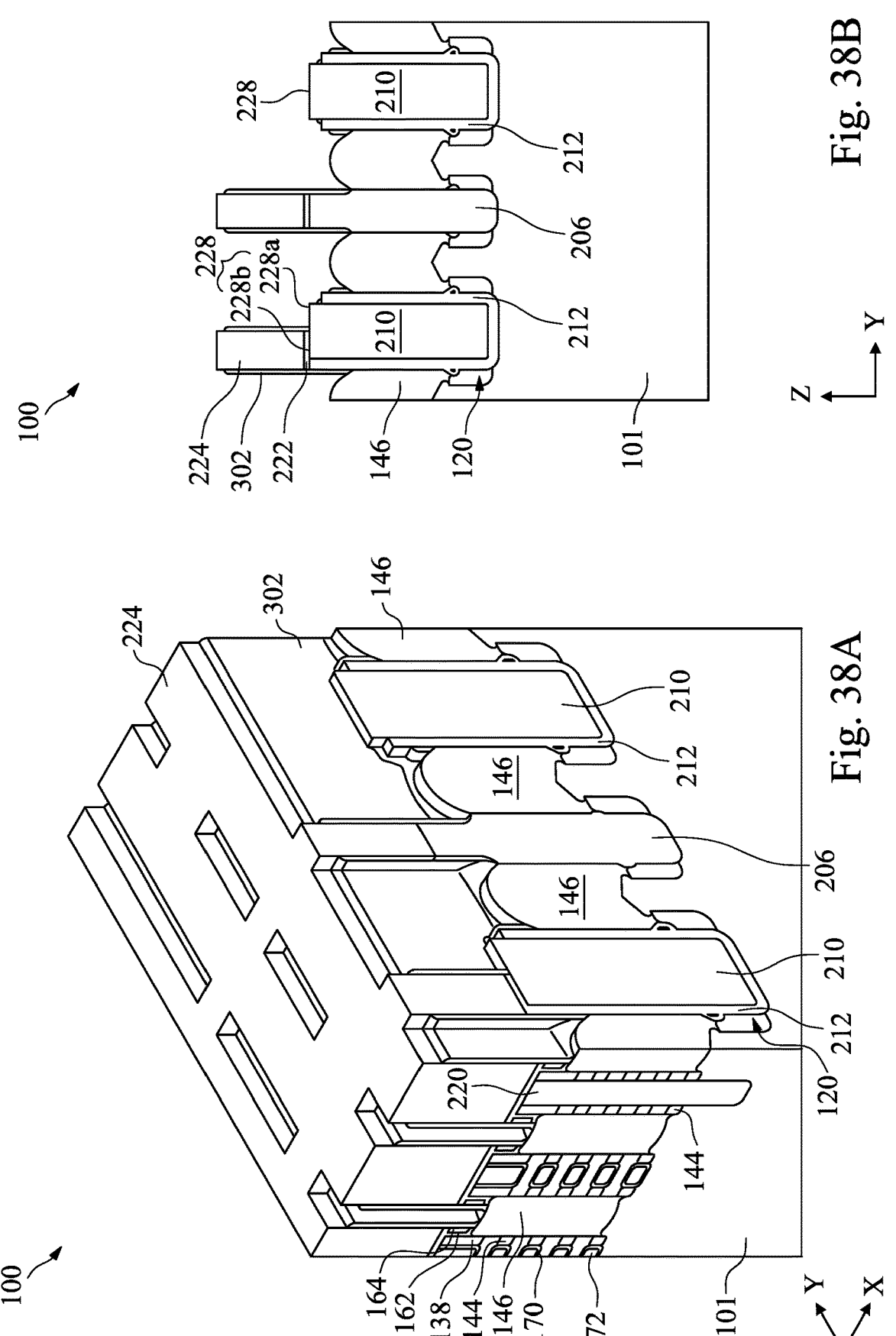
Figures 39A, 39B:
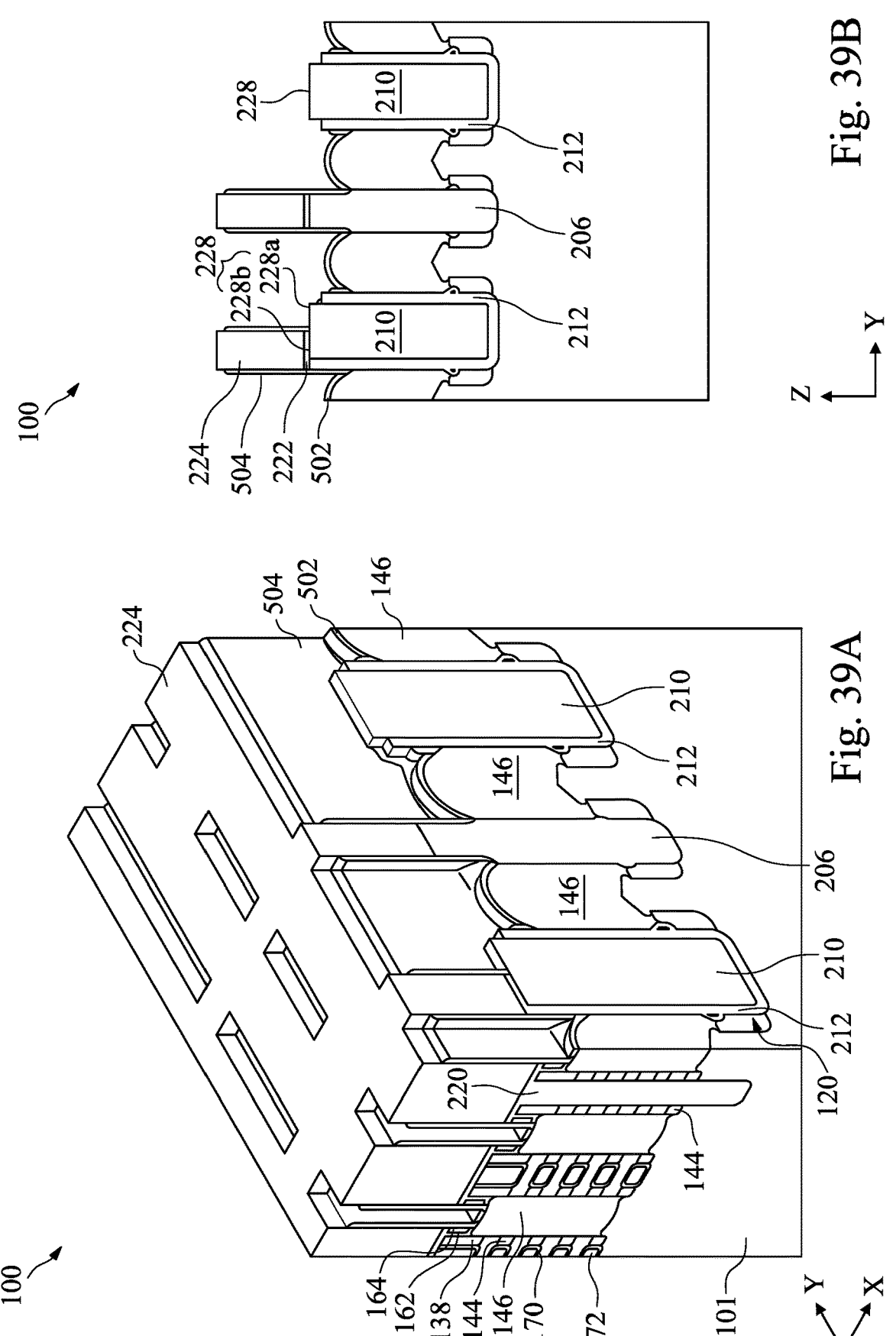
Figures 40A, 40B:
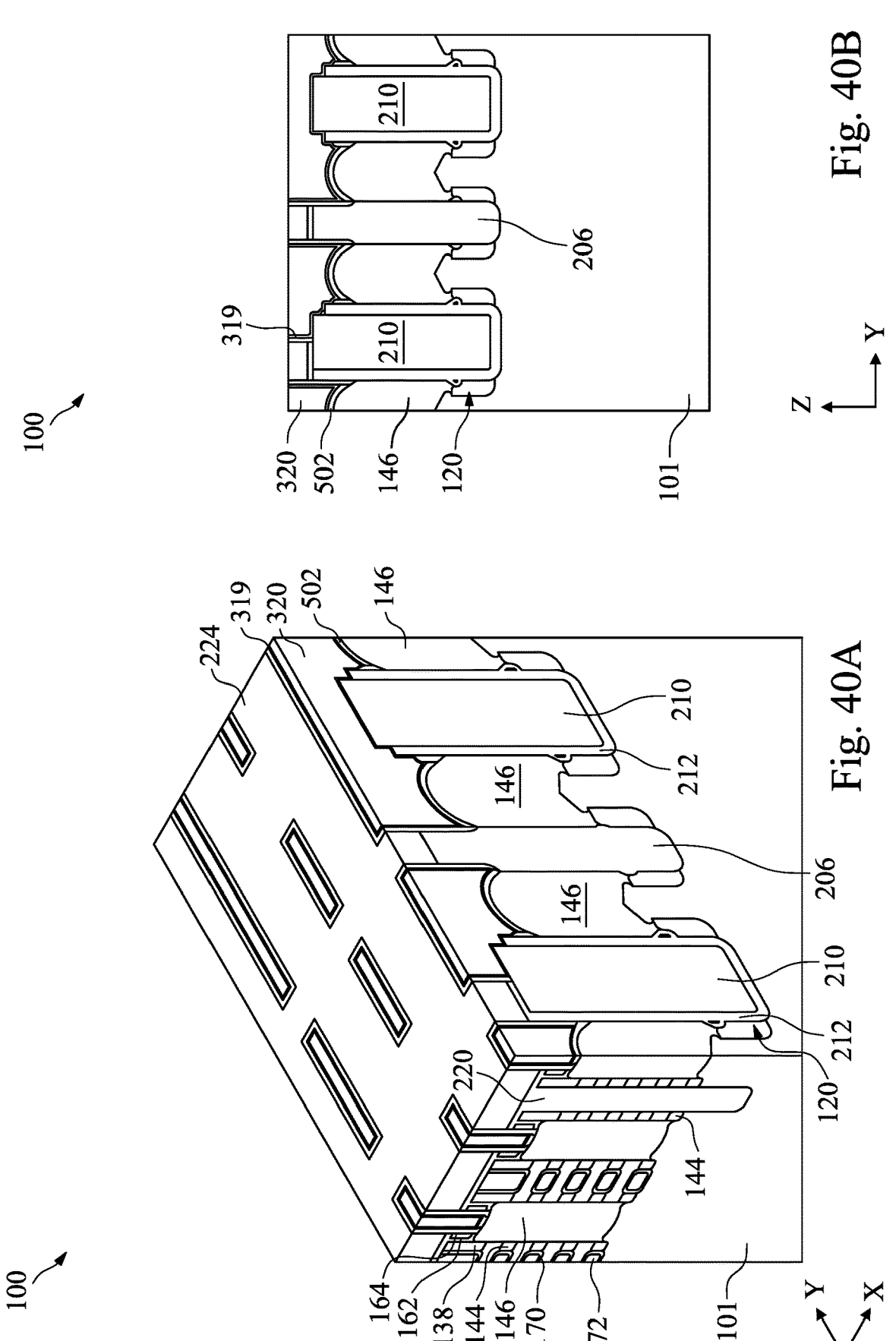
Figures 41A, 41B:
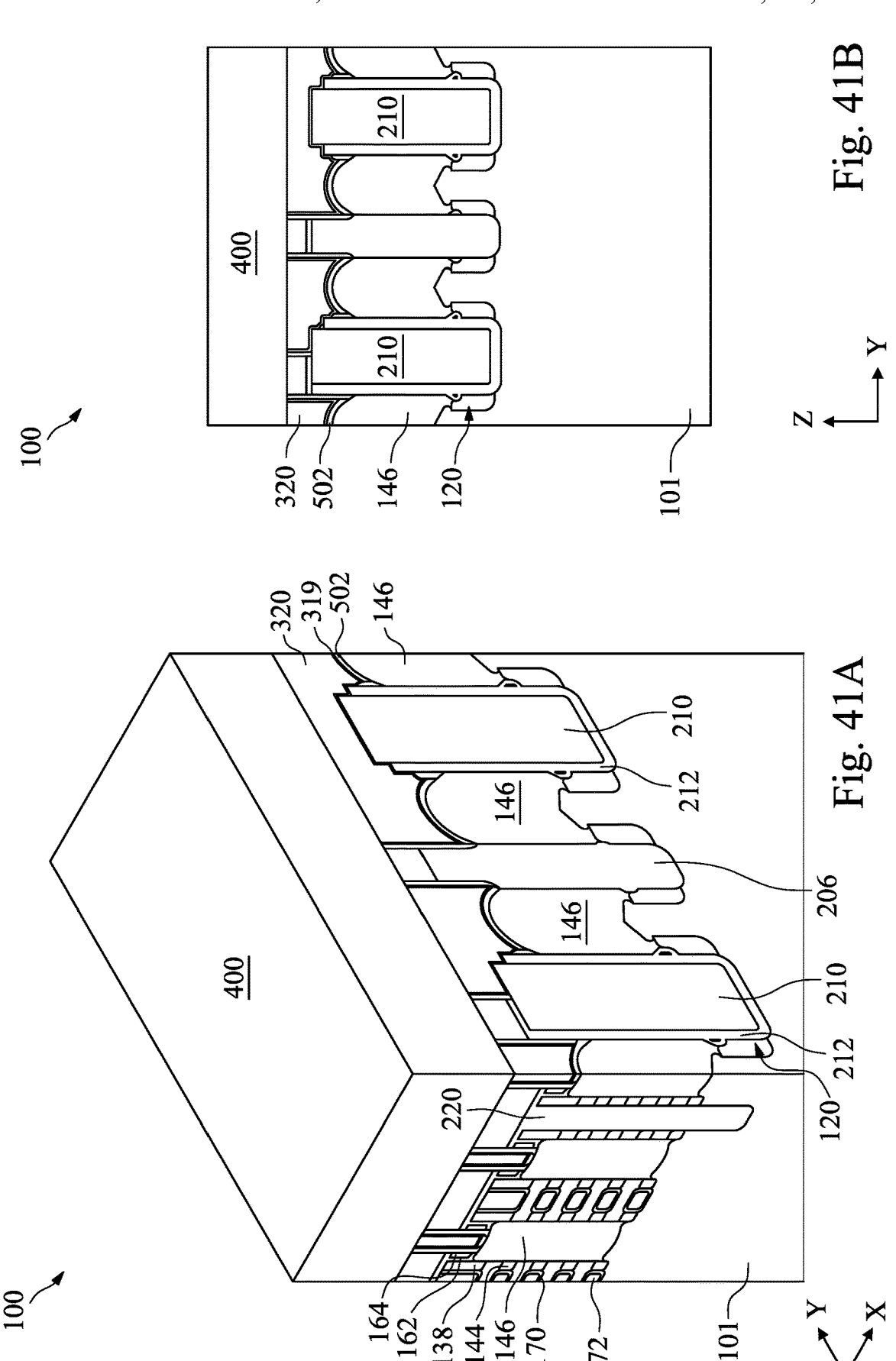

As shown in FIGS. 37A and 37B, the semiconductor device structure 100 is at the same manufacturing stage as the semiconductor device structure 100 shown in FIGS. 24A and 24B. As shown in FIGS. 38A and 38B, the liners 302 are formed on the vertical surfaces of the semiconductor device structure 100, and the S/D regions 146 are exposed. As shown in FIGS. 39A and 39B, silicide layers 502 are formed on the exposed S/D regions 146, and the liners 302 are converted to a nitride layer 504. In some embodiments, the silicide layers 502 include TiSi, and the nitride layer 504 includes TiSiN. Unlike the previously described processes that form different silicide layers in the PFET and NFET regions, the silicide layers 502 are formed in both PFET and NFET regions. As shown in FIGS. 40A and 40B, the conductive features 320 are formed over the S/D regions and the conductive features 210. As described above, the conductive features 320 are electrically connected to the S/D regions 146 and the conductive features 210. Similarly, the optional barrier layer 319 may be formed between the conductive features 320 and the silicide layers 502. As shown in FIGS. 41A and 41B, the interconnect structure 400 is formed on the ILD layer 224 and the conductive features 320.

Figures 42A, 42B:
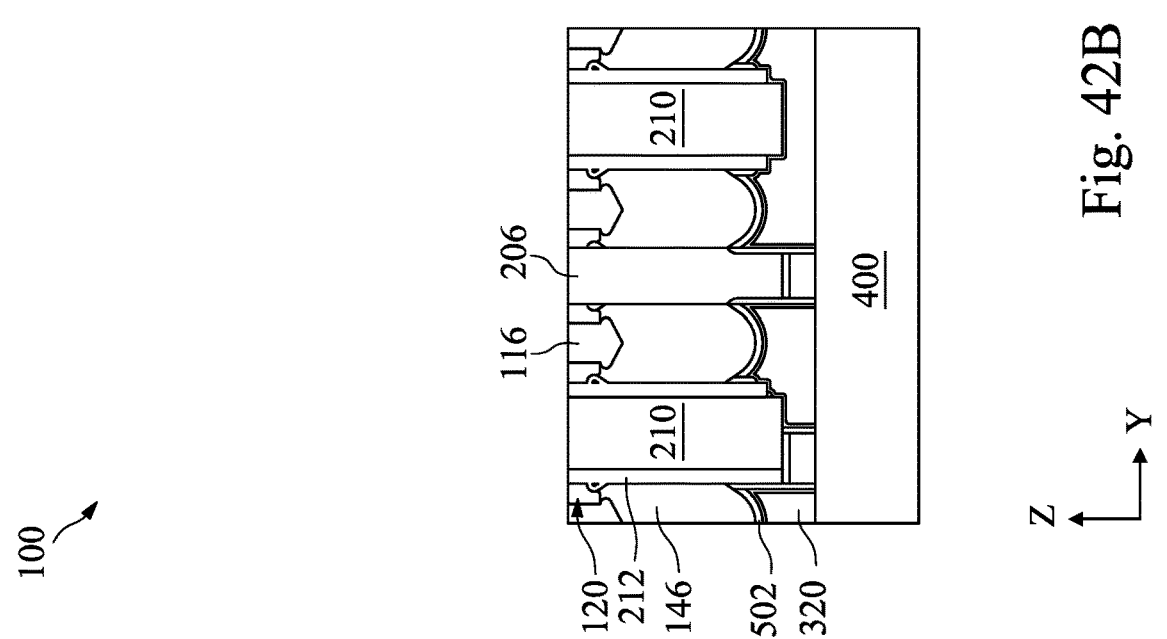

As shown in FIGS. 42A and 42B, the semiconductor device structure 100 is flipped over, and the substrate 101 is thinned down. As a result, the semiconductor device structure 100 has a substantially planar top surface (bottom surface if the semiconductor device structure 100 is oriented front side up). As shown in FIGS. 42A and 42B, at the current stage of manufacturing of the semiconductor device structure 100, the top surface of the semiconductor device structure 100 includes a top surface of each dielectric material 206, a top surface of the dielectric material 220, a top surface of each isolation region 120, a top surface of each liner 212, a top surface of each well portion 116, and a top surface of each conductive feature 210. In other words, all the top surfaces of the dielectric materials 206, the dielectric material 220, the isolation regions 120, the liners 212, the well portions 116, and the conductive features 210 are substantially coplanar.

Figures 43A, 43B:
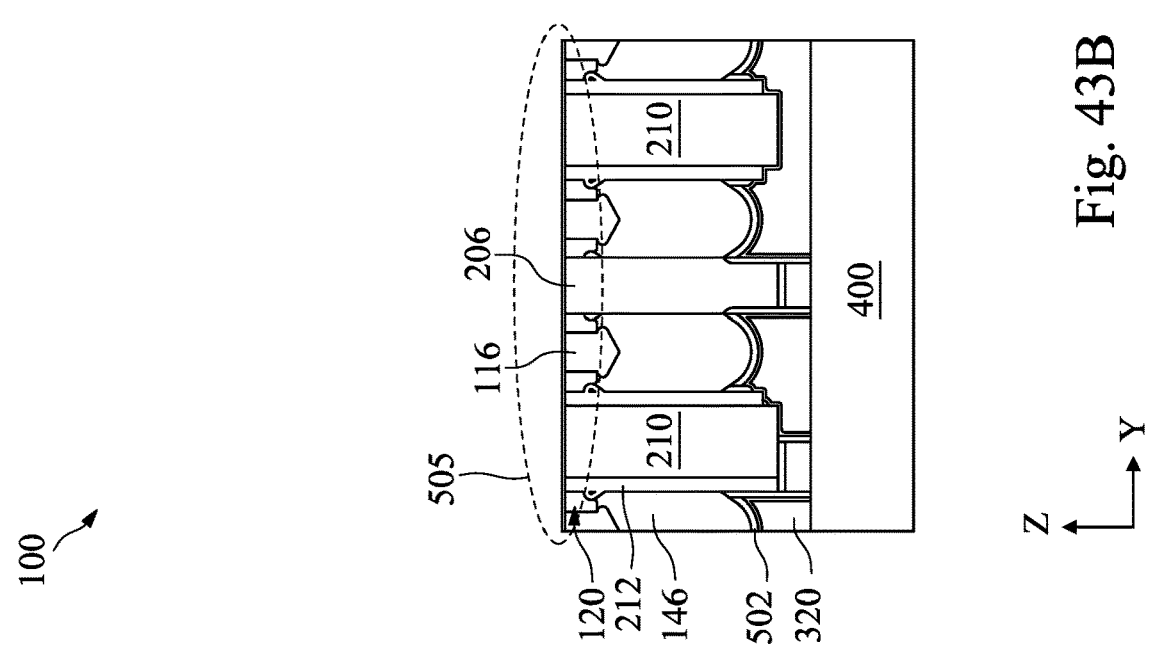
Figures 1, 43B:
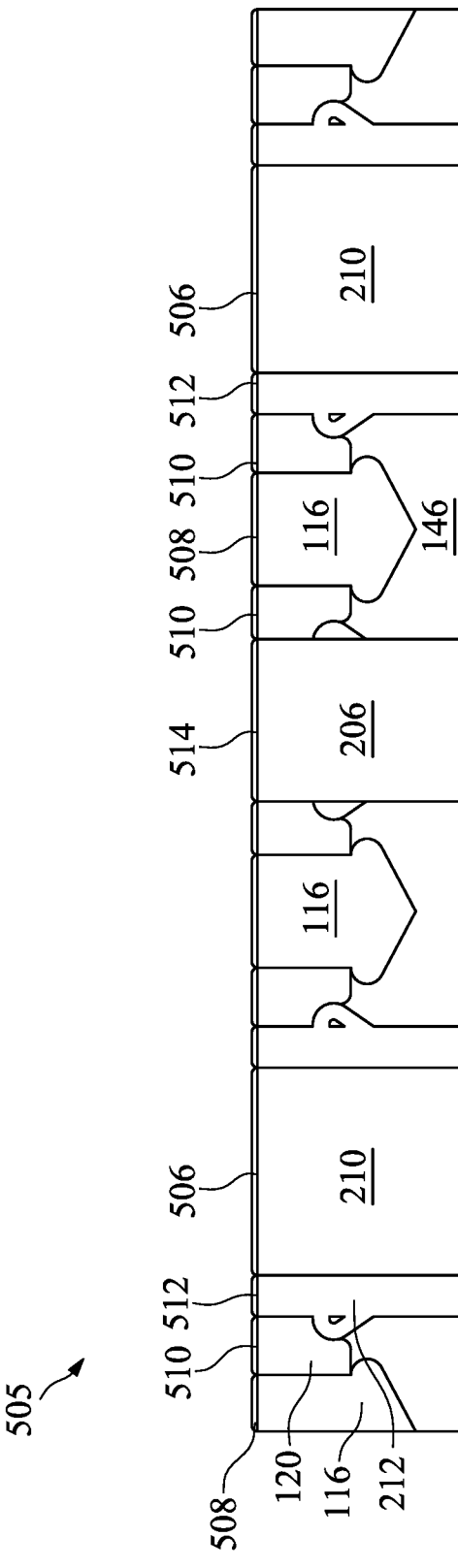

As shown in FIGS. 43A and 43B, a treatment process is performed on the top surface (bottom surface if the semiconductor device structure 100 is oriented front side up) of the semiconductor device structure 100. In some embodiments, the treatment process includes a nitrogen treatment process. For example, the top surface of the semiconductor device structure 100 may be exposed to a nitrogen-containing gas, such as ammonia or nitrogen gas, along with or without hydrogen gas. In some embodiments, the treatment process is a plasma treatment process, and an RF power ranges from about 30 W to about 1000 W. The flow rates of the gases may range from about 5 sccm to about 1000 sccm, and the process pressure may range from about 0.05 Torr to about 10 Torr. The treatment process converts the top surface of the conductive feature 210 to a nitride layer 506, as shown in FIG. 43A. The nitride layer 506 may be a metal nitride layer, such as $W_xN_y$, $Ru_xN_y$, $Co_xN_y$, $Mo_xN_y$, or TiN. In some embodiments, a portion of the nitride layer 506 may be oxidized as a result of exposing to oxygen during the subsequent process for forming the dielectric layer 402. As a result, the nitride layer 506 may include an oxide, such as $W_xO_y$, $Ru_xO_y$, $Co_xO_y$, $Mo_xO_y$, or TiO. The nitride layer 506 may have a thickness ranging from about 0.5 nm to about 4 nm. The nitride layer 506 functions as a barrier layer to prevent the intermixing of the conductive feature 210 and the subsequently formed conductive feature 404.

FIG. 43B-1 is an enlarged view of a portion 505 of the semiconductor device structure 100 shown in FIG. 43B. As shown in FIG. 43B-1, the treatment process also converts other top surfaces of the semiconductor device structure 100 to various layers. For example, the top surface of the well portion 116 is converted to a nitride layer 508, the top surface of the isolation region 120 is converted to a nitride layer 510, the top surface of the liner 212 is converted to a nitride layer 512, the top surface of the dielectric material 206 is converted to a nitride layer 514, and the top surface of the dielectric material 220 (FIG. 42A) is converted to a nitride layer (not shown). The nitride layers 508, 510, 512, 514 may include SiN, SiOCN, SiCN, AlON, SiON, or other suitable material. In some embodiments, the nitride layer 508 includes SiN. In some embodiments, the dielectric material 206, the liner 212, and the dielectric material 220 include SiN, and the corresponding nitride layers include SiN with a higher concentration of nitrogen.

In some embodiments, in addition to the treatment process, an implantation process may be also performed on the top surface of the semiconductor device structure 100 (bottom surface if the semiconductor device structure 100 is oriented front side up). The implantation process may be performed to convert the nitride layers 506 to amorphous layers, which further reduces metal diffusion. In some embodiments, the dopant species include $N_2$ or Ge. The ion beam energy may be less than about 1 keV, and the implantation dose may be greater than 1E15 atom/cm². The implantation tilt angle may be at zero degree. In some embodiments, Ge is used in the implantation process, and the nitride layers 506, 508, 510, 512, 514 are doped with Ge.

As a result of the treatment process (and the implantation process), the top surface of the semiconductor device structure 100 at the current stage includes various nitride layers.

Figures 44A, 44B:
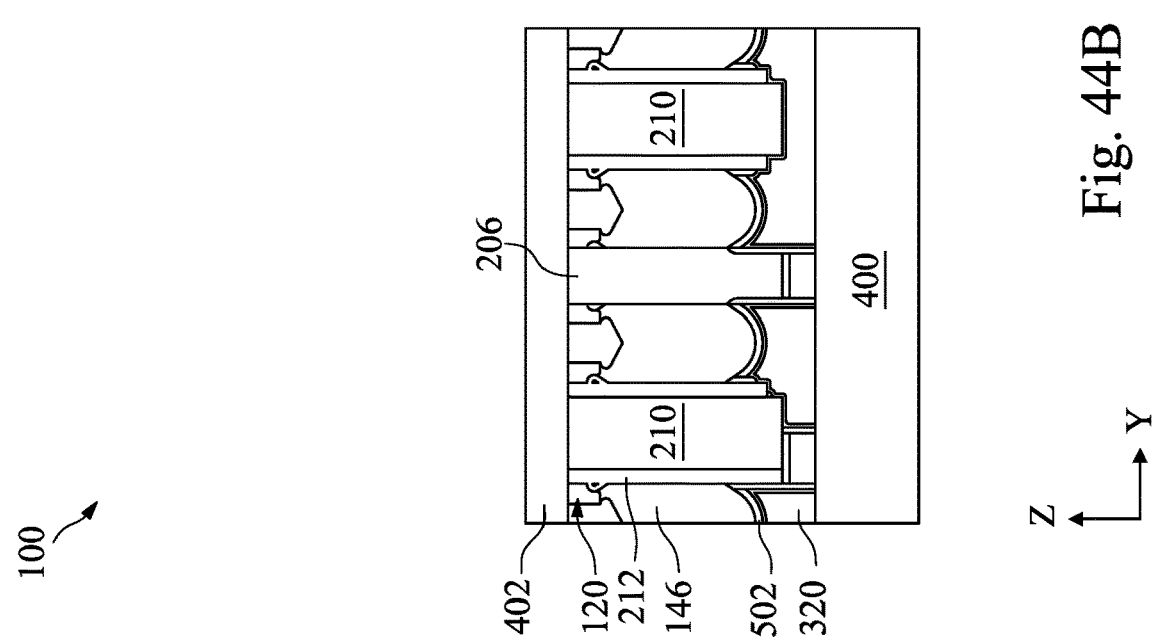
Figure 45B:
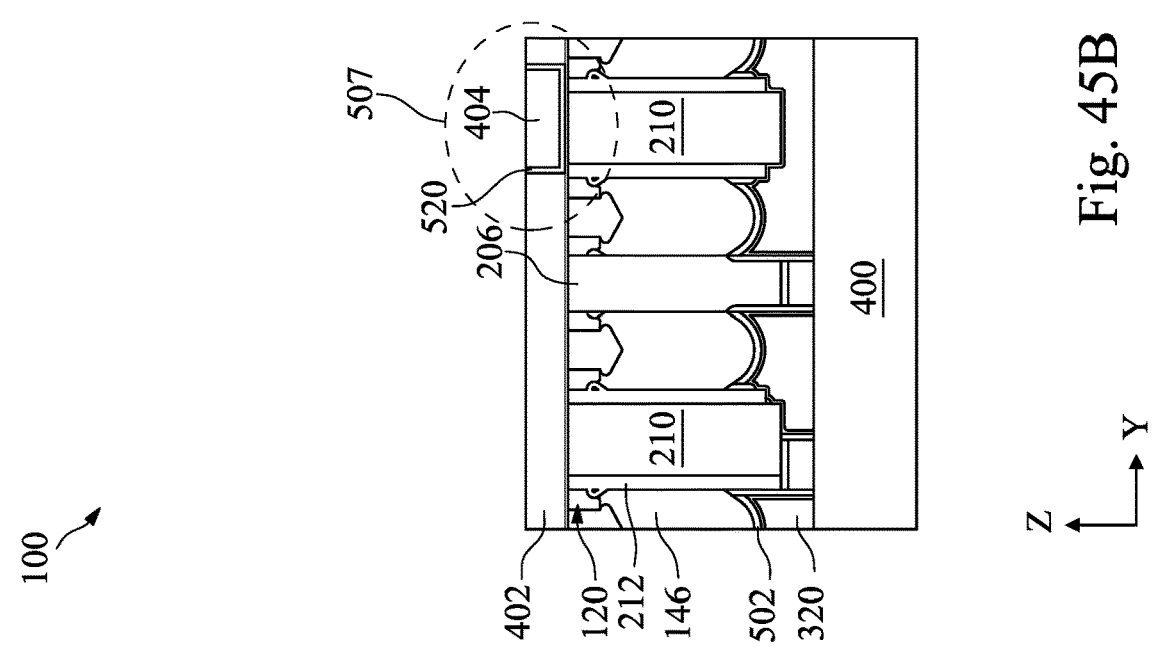
Figure 45A:
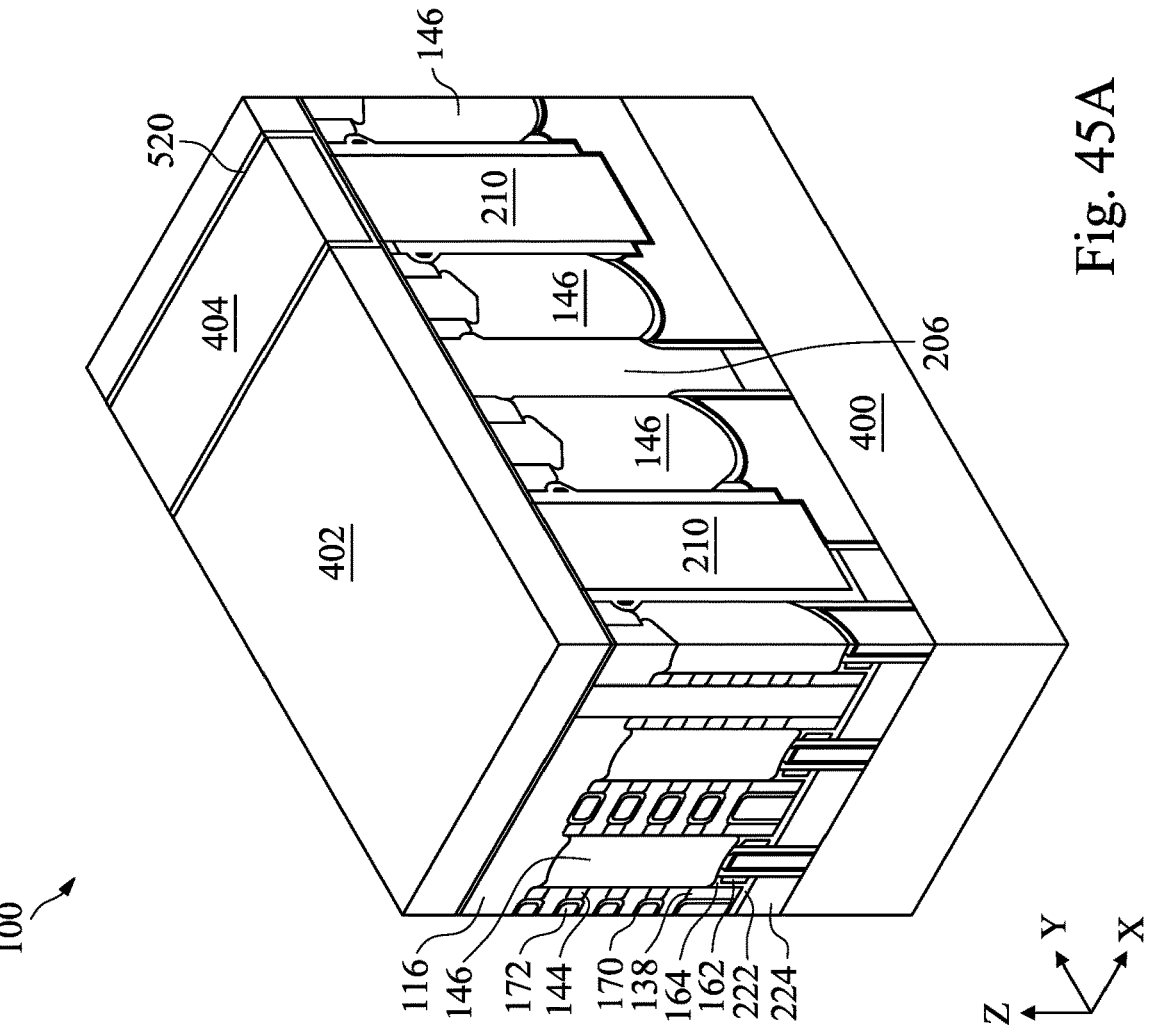
Figures 1, 45B:
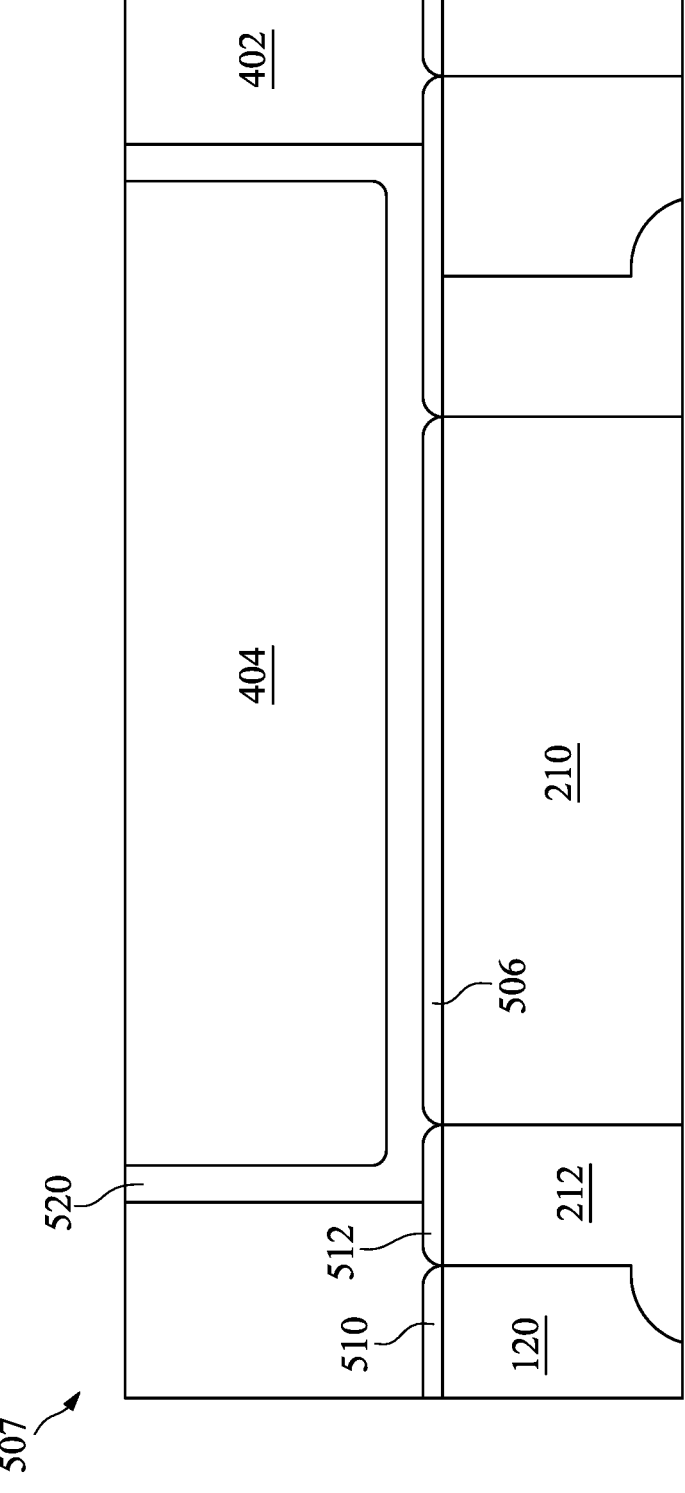

As shown in FIGS. 44A and 44B, the dielectric layer 402 is deposited on the various nitride layers. In some embodiments, the dielectric layer 402 includes SiN, SiOCN, SiCN, AlON, or SiON. As shown in FIGS. 45A and 45B, the conductive feature 404 is formed in the dielectric layer 402. In some embodiments, a barrier layer 520 is formed in the dielectric layer 402, and the conductive feature 404 is formed on the barrier layer 520. The barrier layer 520 may include TiN or TaN and may have a thickness ranging from about 3 nm to about 10 nm. In some embodiments, the barrier layer 520 is not present, and the conductive feature 404 is in contact with the nitride layer 506. FIG. 45B-1 is an enlarged view of a portion 507 of the semiconductor device structure 100 shown in FIG. 45B. As shown in FIG. 45B-1, in some embodiments, the barrier layer 520 is in contact with the nitride layer 506, and both the barrier layer 520 and the nitride layer 506 prevent the intermixing of the conductive features 210, 404. In some embodiments, the barrier layer 520 is not present, and the nitride layer 506 alone prevents the intermixing of the conductive features 210, 404.

The methods for reducing intermixing of the conductive features 404, 210 described in FIGS. 37A-45B may be combined with the processes described in FIGS. 1-36B.

Embodiments of the present disclosure provide a semiconductor device structure including different silicide layers in PFET region and NFET region. Embodiments of the present disclosure also provides a semiconductor device structure including a nitride layer between conductive features. Some embodiments may achieve advantages. For example, the different silicide layers in PFET region and NFET region reduces source/drain contact resistance, and nitride layer located between the conductive features prevents intermixing of the conductive features.

An embodiment is a semiconductor device structure. The structure includes a first source/drain region disposed in a PFET region and a second source/drain region disposed in an NFET region. The second source/drain region comprises a dipole region. The structure further includes a first silicide layer disposed on and in contact with the first source/drain region, a second silicide layer disposed on and in contact with the first silicide layer, and a third silicide layer disposed on and in contact with the dipole region of the second source/drain region. The first, second, and third silicide layers include different materials. The structure further includes a first conductive feature disposed over the first source/drain region, a second conductive feature disposed over the second source/drain region, and an interconnect structure disposed on the first and second conductive features.

Another embodiment is a semiconductor device structure. The structure includes a source/drain region, a well portion disposed on the source/drain region, an isolation region surrounding the well portion, a first conductive feature adjacent the source/drain region, a first nitride layer disposed on the first conductive feature, a second nitride layer disposed on the well portion, a third nitride layer disposed on the isolation region, a dielectric layer disposed on the second and third nitride layers, and a second conductive feature disposed in the dielectric layer. The second conductive feature is electrically connected to the first conductive feature.

A further embodiment is a method for forming a semiconductor device structure. The method includes forming a first source/drain region in a PFET region and a second source/drain region in an NFET region, forming a dipole region in the second source/drain region, forming a first silicide layer on the first source/drain region, forming a second silicide layer on the first silicide layer, and forming a third silicide layer on the dipole region. The first, second, and third silicide layers comprise different materials. The method further includes forming a conductive material over the second and third silicide layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a first source/drain region disposed in a PFET region;
a second source/drain region disposed in an NFET region, wherein the second source/drain region comprises a dipole region, and the first source/drain region is free of the dipole region;
a first silicide layer disposed on the first source/drain region;
a second silicide layer disposed on the first silicide layer;
a third silicide layer disposed on the dipole region of the second source/drain region, wherein the first, second, and third silicide layers comprise different materials;
a first conductive feature disposed over the first source/drain region;
a second conductive feature disposed over the second source/drain region;
a third conductive feature disposed adjacent the first source/drain region;
a liner disposed between the first source/drain region and the third conductive feature; and
an interconnect structure disposed over the first and second conductive features.

2. The semiconductor device structure of claim 1, wherein a top surface of the third conductive feature is located at a level higher than a top surface of the first source/drain region.

3. The semiconductor device structure of claim 2, wherein the first conductive feature is electrically connected to the third conductive feature.

4. The semiconductor device structure of claim 3, further comprising an alloy layer disposed on at least a portion of the third conductive feature.

5. The semiconductor device structure of claim 4, further comprising a nitride layer disposed on and in contact with the second silicide layer, the third silicide layer, and the alloy layer.

6. The semiconductor device structure of claim 5, further comprising a barrier layer disposed on and in contact with the nitride layer, wherein the barrier layer is in contact with the first and second conductive features.

7. The semiconductor device structure of claim 1, wherein the first silicide layer comprises MoSiGe, RuSiGe, NiSiGe, or CoSiGe.

8. The semiconductor device structure of claim 7, wherein the second silicide layer comprises MoTiSiGe, RuTiSiGe, NiTiSiGe, or CoTiSiGe.

9. The semiconductor device structure of claim 8, wherein the third silicide layer comprises TiSi.

10. A semiconductor device structure, comprising:
a source/drain region;
a well portion disposed on the source/drain region;
an isolation region surrounding the well portion;
a first conductive feature adjacent the source/drain region, wherein the first conductive feature is electrically coupled to the source/drain region;
a liner disposed between the source/drain region and the first conductive feature;
a first nitride layer disposed on the first conductive feature;
a second nitride layer disposed on the well portion;
a third nitride layer disposed on the isolation region;
a dielectric layer disposed on the second and third nitride layers; and
a second conductive feature disposed in the dielectric layer, wherein the second conductive feature is electrically connected to the first conductive feature.

11. The semiconductor device structure of claim 10, further comprising a third conductive feature electrically connected to the first conductive feature, wherein the source/drain region is disposed over the third conductive feature.

12. The semiconductor device structure of claim 11, further comprising a silicide layer disposed between the source/drain region and the third conductive feature.

13. The semiconductor device structure of claim 10, further comprising a fourth nitride layer disposed on the liner, wherein the dielectric layer is disposed on the fourth nitride layer.

14. The semiconductor device structure of claim 10, further comprising a barrier layer disposed between the first nitride layer and the second conductive feature.

15. A method for forming a semiconductor device structure, comprising:
forming a first source/drain region in a PFET region and a second source/drain region in an NFET region;
forming a conductive feature adjacent the first source/drain region, wherein a liner is formed between the first source/drain region and the conductive feature;
forming a dipole region in the second source/drain region, wherein the first source/drain region is free of the dipole region;
forming a first silicide layer on the first source/drain region;
forming a second silicide layer on the first silicide layer;
forming a third silicide layer on the dipole region, wherein the first, second, and third silicide layers comprise different materials; and
forming a conductive material over the second and third silicide layers.

16. The method of claim 15, wherein the forming the first silicide layer comprises selectively depositing a metal layer on the first source/drain region.

17. The method of claim 16, wherein the forming the first silicide layer further comprises performing an anneal process.

18. The method of claim 17, further comprising removing an unreacted portion of the metal layer.

19. The method of claim 15, further comprising forming a barrier layer over the second and third silicide layers, wherein the conductive material is formed on the barrier layer.

20. The method of claim 15, wherein a top surface of the conductive feature is located at a level higher than a top surface of the first source/drain region.

* * * * *